US011049578B1

(12) United States Patent
Murai et al.

(10) Patent No.: US 11,049,578 B1
(45) Date of Patent: Jun. 29, 2021

(54) NON-VOLATILE MEMORY WITH PROGRAM VERIFY SKIP

(71) Applicant: SANDISK TECHNOLOGIES LLC, Addison, TX (US)

(72) Inventors: Shota Murai, Fujisawa (JP); Henry Chin, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/795,313

(22) Filed: Feb. 19, 2020

(51) Int. Cl.
*G11C 16/34* (2006.01)
*G11C 16/10* (2006.01)
*G11C 16/28* (2006.01)
*G11C 16/04* (2006.01)
*G11C 29/50* (2006.01)
*G11C 11/56* (2006.01)
*G11C 5/02* (2006.01)

(52) U.S. Cl.
CPC .......... *G11C 16/3459* (2013.01); *G11C 5/025* (2013.01); *G11C 11/5628* (2013.01); *G11C 16/0483* (2013.01); *G11C 16/105* (2013.01); *G11C 16/28* (2013.01); *G11C 16/3454* (2013.01); *G11C 29/50004* (2013.01); *G11C 2029/5004* (2013.01)

(58) Field of Classification Search
CPC . G11C 16/34; G11C 16/3454; G11C 16/3459; G11C 16/0483; G11C 16/105; G11C 16/28; G11C 5/025; G11C 11/5628; G11C 29/50004; G11C 2029/5004
USPC .......................................... 365/185.22, 185.2
See application file for complete search history.

(56) References Cited

U.S. PATENT DOCUMENTS

| | | |
|---|---|---|
| 6,888,758 B1 | 5/2005 | Hemink et al. |
| 7,020,026 B2 | 3/2006 | Guterman |
| 7,092,290 B2 | 8/2006 | Hemink |
| 7,139,198 B2 | 11/2006 | Guterman |

(Continued)

FOREIGN PATENT DOCUMENTS

DE   10 2018 106 111   12/2018

OTHER PUBLICATIONS

Office Action dated Oct. 13, 2020, German Patent Application No. 10 2020 115 935.8.

*Primary Examiner* — Son L Mai
(74) *Attorney, Agent, or Firm* — Vierra Magen Marcus LLP

(57) ABSTRACT

Non-volatile memory cells are programmed by applying a programming signal as a series of programming voltage pulses (or other doses of programming) to selected memory cells and verifying the memory cells between programming voltage pulses. To achieve tighter threshold voltage distributions, a coarse/fine programming process is used that includes a two step verification between programming voltage pulses comprising an intermediate verify condition and a final verify condition. Memory cells being programmed that have reached the intermediate verify condition are slowed down for further programming. Memory cells being programmed that have reached the final verify condition are inhibited from further programming. To reduce the number of verify operations performed, a system is proposed for skipping verification at the intermediate verify condition for some programming voltage pulses and skipping verification at the final verify condition for some programming voltage pulses.

20 Claims, 19 Drawing Sheets

(56) References Cited

U.S. PATENT DOCUMENTS

| | | | |
|---|---|---|---|
| 7,206,235 B1 * | 4/2007 | Lutze | G11C 7/02 |
| | | | 365/185.02 |
| 7,301,817 B2 | 11/2007 | Lee | |
| 7,447,081 B2 | 11/2008 | Chan | |
| 7,508,715 B2 | 3/2009 | Lee | |
| 7,508,721 B2 | 3/2009 | Li | |
| 7,688,638 B2 | 3/2010 | Hemink | |
| 8,120,967 B2 * | 2/2012 | Kang | G11C 16/3454 |
| | | | 365/185.22 |
| 8,174,895 B2 | 5/2012 | Chen | |
| 8,233,324 B2 | 7/2012 | Sharon | |
| 8,432,740 B2 | 4/2013 | Li | |
| 8,675,416 B2 * | 3/2014 | Lee | G11C 16/3459 |
| | | | 365/185.22 |
| 8,705,293 B2 | 4/2014 | She | |
| 8,971,141 B2 | 3/2015 | Mui | |
| 9,142,298 B2 | 9/2015 | Dong | |
| 9,443,606 B2 | 9/2016 | Dutta | |
| 10,014,063 B2 | 7/2018 | Tseng | |
| 10,102,909 B2 * | 10/2018 | Park | G11C 16/0483 |
| 10,381,095 B1 | 8/2019 | Date | |
| 2006/0146610 A1 | 7/2006 | Takeuchi | |

* cited by examiner

Figure 5
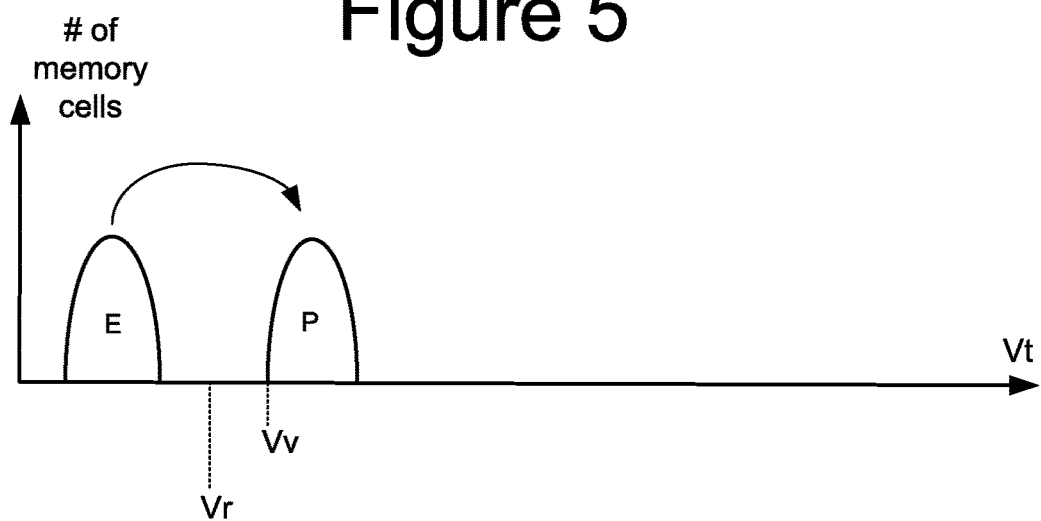
Figure 6
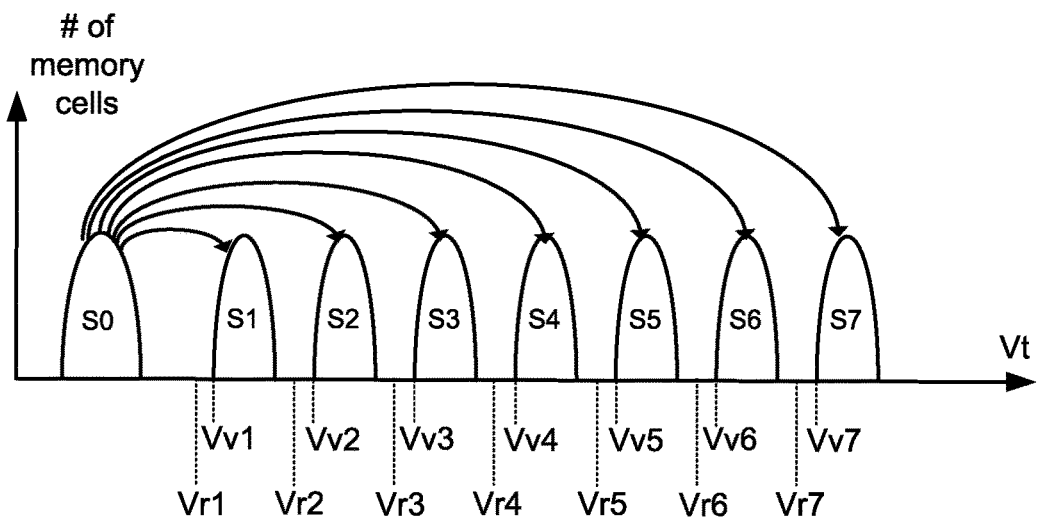
Figure 7
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

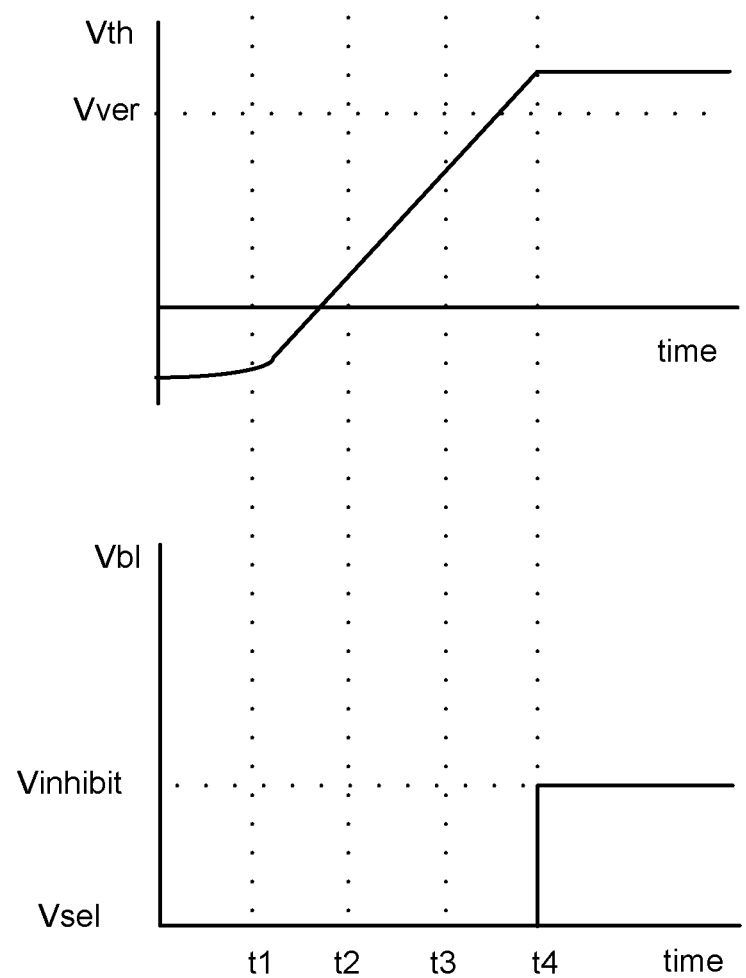

NON-VOLATILE MEMORY WITH PROGRAM VERIFY SKIP

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). An example of non-volatile memory is flash memory (e.g., NAND-type and NOR-type flash memory). Users of non-volatile memory typically want the memory to operate at high speeds so that they do not need to wait for memory operations to be completed.

BRIEF DESCRIPTION OF THE DRAWINGS

Like-numbered elements refer to common components in the different figures.

FIG. 5 depicts threshold voltage distributions.

FIG. 6 depicts threshold voltage distributions.

FIG. 7 is a table describing one example of an assignment of data values to data states.

FIG. 13A is a graph describing the bit line voltage during a programming process.

DETAILED DESCRIPTION

Non-volatile memory cells are programmed by applying a programming signal as a series of programming voltage pulses (or other doses of programming) to selected memory cells and verifying the memory cells between programming voltage pulses. To achieve tighter threshold voltage distributions, a coarse/fine programming process is used that includes a two step verification between programming voltage pulses comprising an intermediate verify condition and a final verify condition. Memory cells being programmed that have reached the intermediate verify condition are slowed down for further programming. Memory cells being programmed that have reached the final verify condition are inhibited from further programming. To reduce the number of verify operations performed, a system is proposed for skipping verification at the intermediate verify condition for some programming voltage pulses and skipping verification at the final verify condition for some programming voltage pulses.

One embodiment of a non-volatile storage apparatus comprises a plurality of non-volatile memory cells and a control circuit connected to the non-volatile memory cells. The control circuit is configured to: perform a programming process that programs the non-volatile memory cells to a first data state (and, possibly, other data states), perform program verification for the intermediate verify condition for the first data state without performing program verification for the final verify condition for the first data state until a first criteria is satisfied, perform program verification for the intermediate verify condition and the final verify condition after the first criteria is satisfied and until a second criteria is satisfied, and perform program verification for the final verify condition without performing program verification for the intermediate verify condition after the second criteria is satisfied. In one example the first criteria is satisfied when a threshold number of the plurality of non-volatile memory cells have reached the intermediate verify condition. In some examples, the second criteria is satisfied when the a threshold number of the plurality of non-volatile memory cells have reached the final verify condition, after a predetermined number of doses of programming have been applied to the plurality of non-volatile memory after the first criteria is satisfied, or a minimum number of non-volatile memory cells has reached a target level for a second data state.

Figure 1:
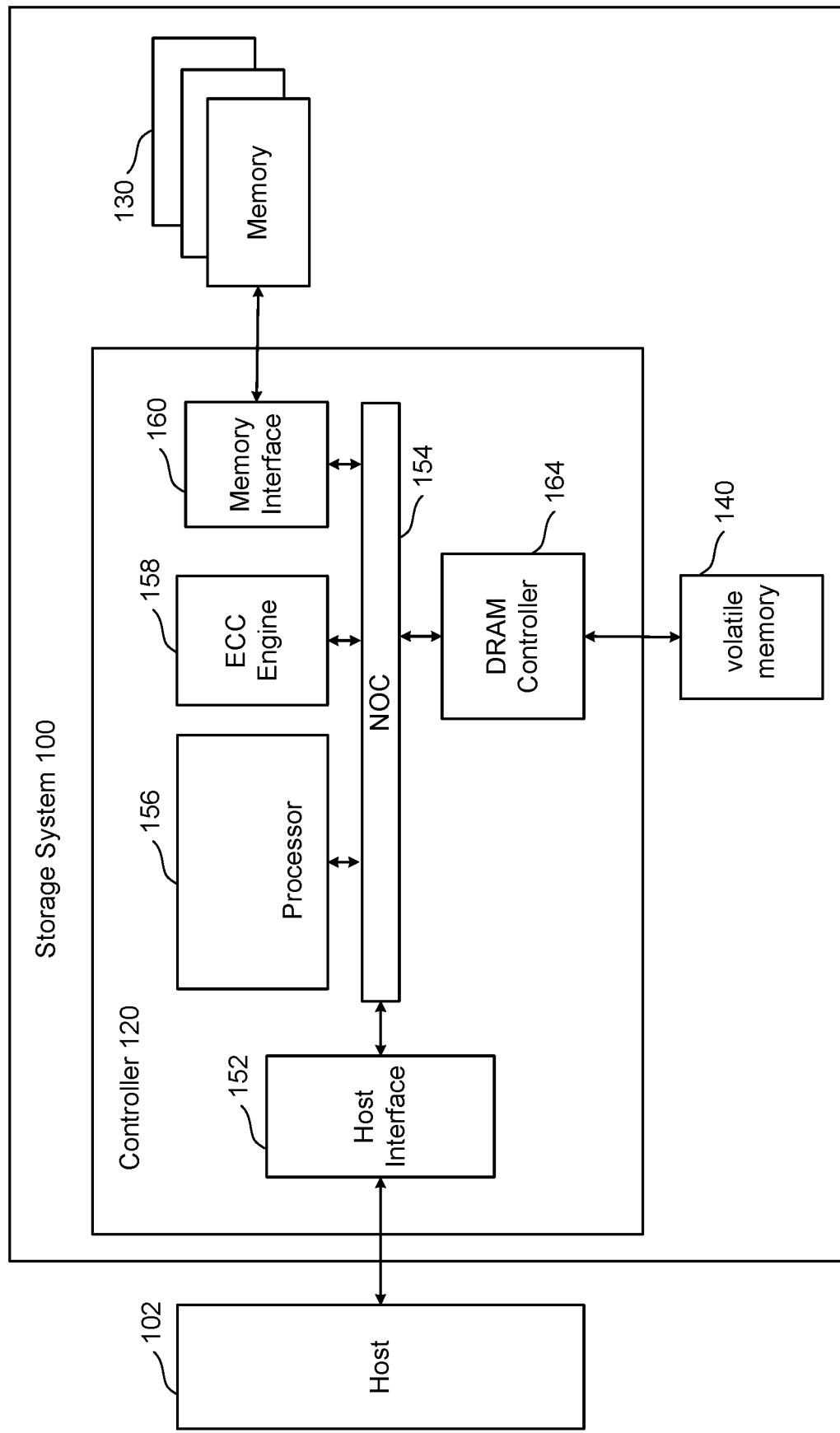
FIG. 1 is a block diagram depicting one embodiment of a memory system.

FIG. 1 is a block diagram of one embodiment of a storage system 100 that implements the proposed technology, including the proposed process for skipping verification. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a controller 120 connected to one or more memory die 130 and local high speed volatile memory 140 (e.g., DRAM). The one or more memory die 130 each comprise a plurality of non-volatile memory cells. More information about the structure of each memory die 130 is provided below. Local high speed volatile memory 140 is used by controller 120 to perform certain functions. For example, local high speed volatile memory 140 stores logical to physical address translation tables ("L2P tables").

Controller 120 comprises a host interface 152 that is connected to and in communication with host 102. In one embodiment, host interface 152 provides a PCIe interface. Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, as well as memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, the controller (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with one or more memory die 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2:
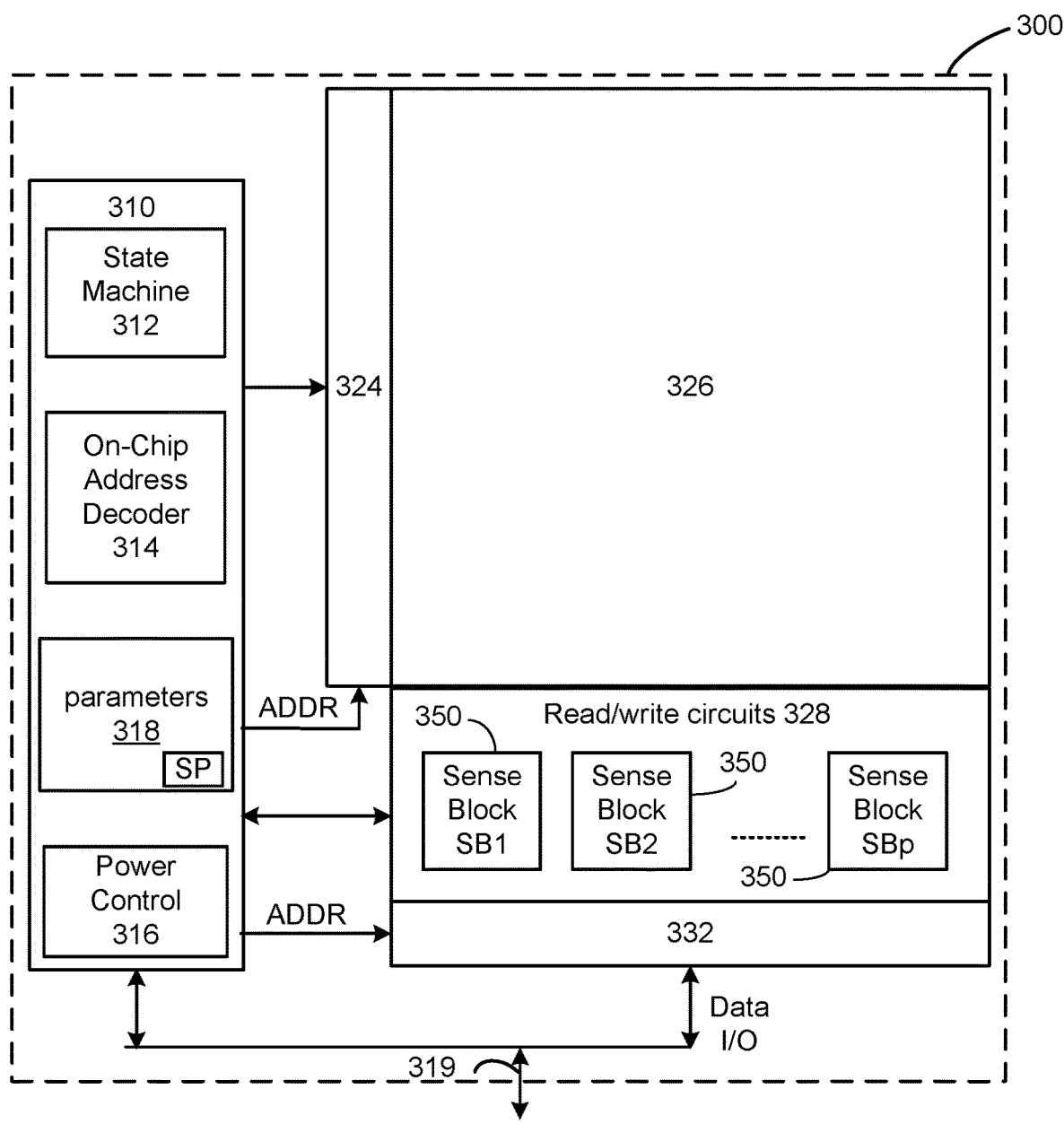
FIG. 2 is a block diagram of one embodiment of a memory die.

FIG. 2 is a functional block diagram of one embodiment of a memory die 300. Each of the one or more memory die 130 of FIG. 1 can be implemented as memory die 300 of FIG. 2. The components depicted in FIG. 2 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed (written) in parallel. In one embodiment, each sense block include a sense amplifier and a set of latches connected to the bit line. The latches store data to be written and/or data that has been read. The sense amplifiers include bit line drivers. Commands and data are transferred between the controller and the memory die 300 via lines 319. In one embodiment, memory die 300 includes a set of input and/or output (I/O) pins that connect to lines 118.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a memory die parameters 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a programmable microcontroller or microprocessor. In one embodiment, control circuitry 310 includes memory die parameters 318 stored in buffers such as registers, latches, ROM fuses and other storage devices. The memory die parameters 318 are default values such as base voltages and other parameters used by memory die 300 (e.g., used by state machines 312) to perform memory operations. One example is the Skip Parameter SP, which is used during one embodiment of the programming process to indicate a predetermined number of programming pulses after first criteria is met to change modes for skipping verification, as described below. In one embodiment, the Skip Parameter SP is set during testing as part of the manufacturing of memory die 300.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, read/write circuits 328 and decoders 324/332 comprise one embodiment of a control circuit for memory structure 326. In other embodiments, other circuits that support and operate on memory structure 326 can be referred to as a control circuit. For example, in some embodiments, controller 120 can operate as the control circuit or can be part of the control circuit. In some embodiments, controller 120 in combination with control circuitry 310, read/write circuits 328 and decoders 324/332 comprise one embodiment of a control circuit. In another embodiment, state machine 312 comprises the control circuit. In another embodiment, the host can provide the control circuit.

In one embodiment, memory structure 326 comprises a monolithic three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. A NAND string includes memory cells connected by a channel.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ferroelectric memories (FeRAM or FeFET), ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a Ge2Sb2Te5 alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
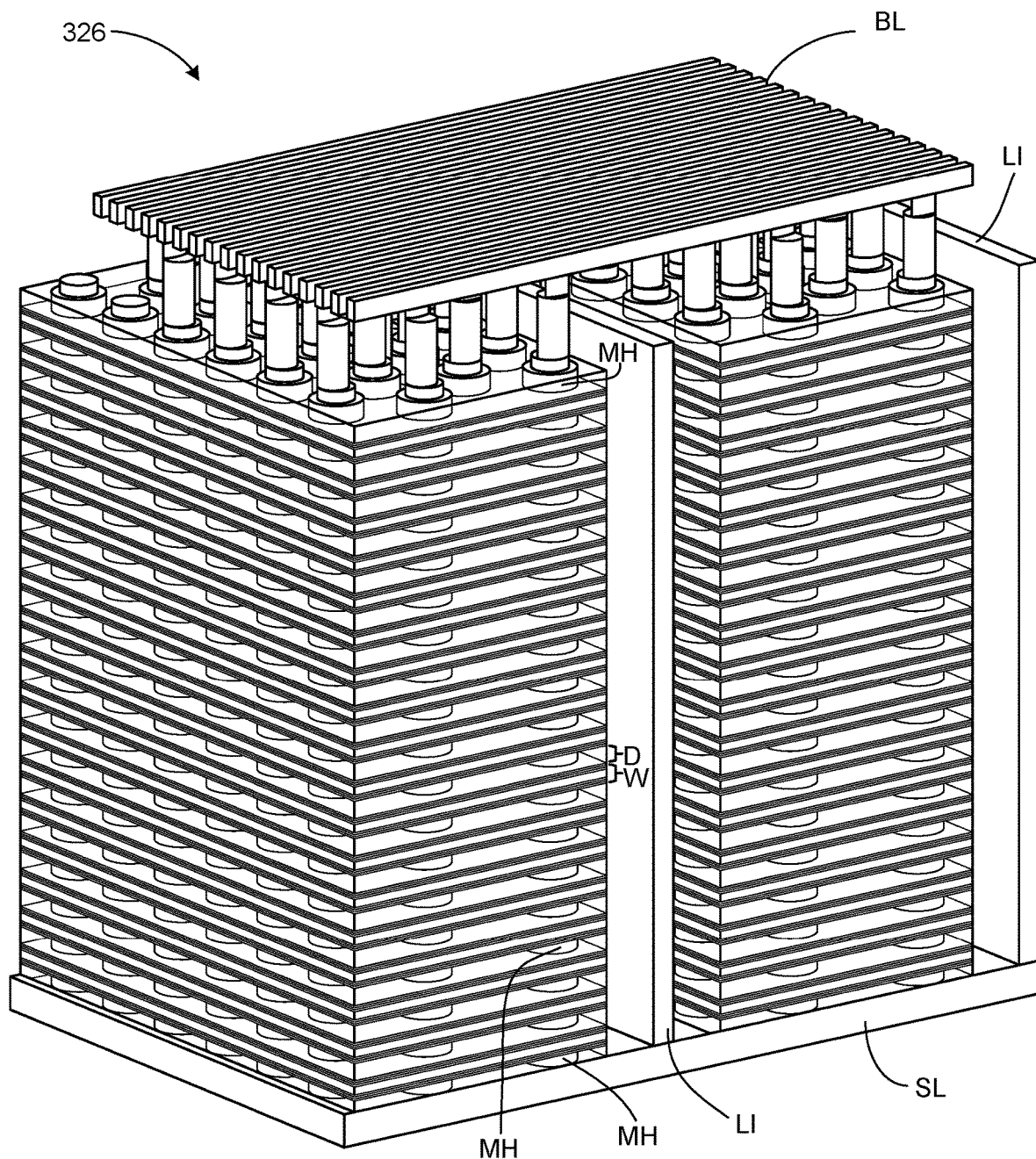
FIG. 3 is a perspective view of a portion of one embodiment of a monolithic three dimensional memory structure.

FIG. 3 is a perspective view of a portion of one example embodiment of a monolithic three dimensional memory array that can comprise memory structure 326, which includes a plurality non-volatile memory cells arranged as vertical NAND strings. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 326 is provided below with respect to FIG. 4A-4F.

Figure 4A:
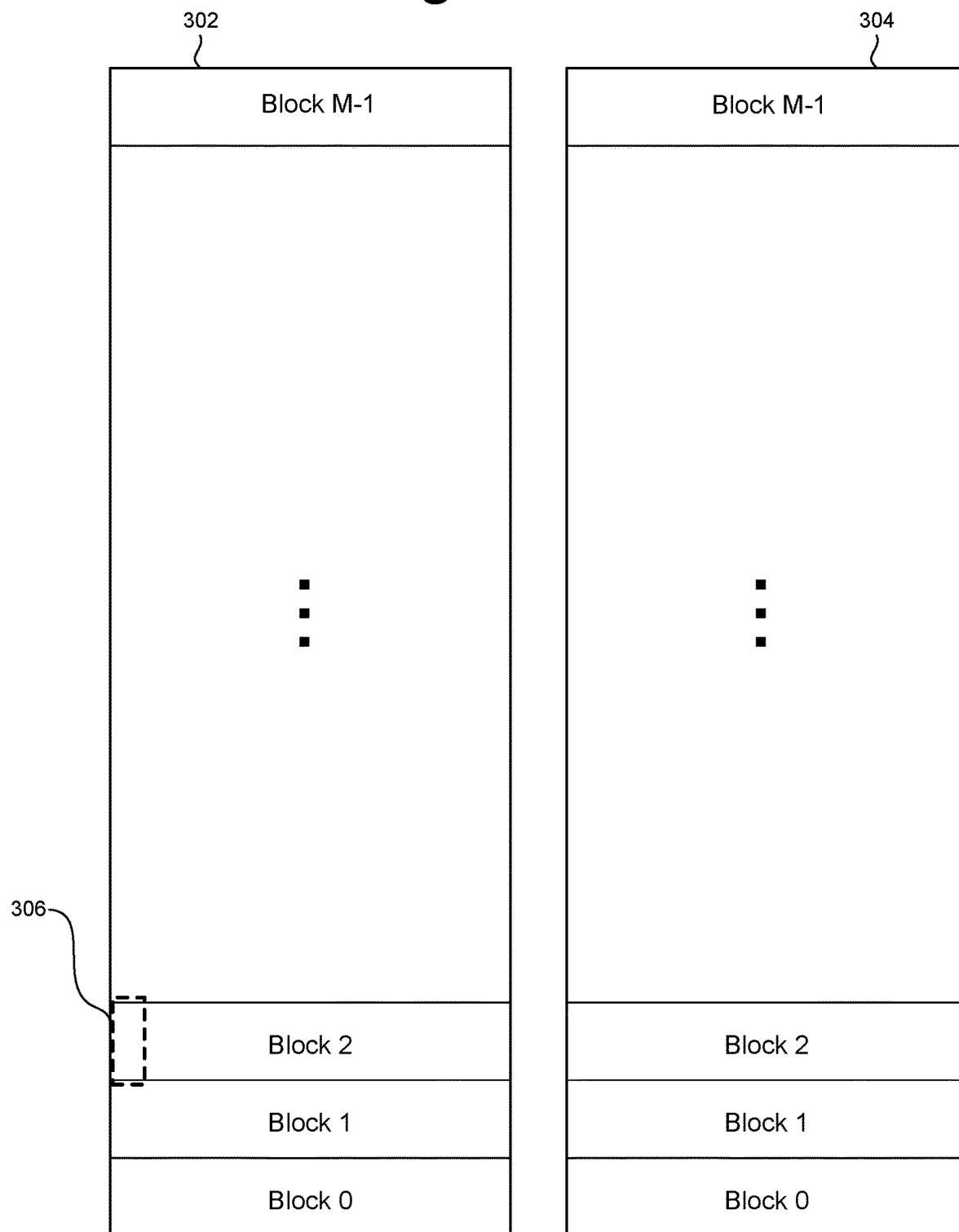
FIG. 4A is a block diagram of a memory structure having two planes.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines.

Figure 4B:
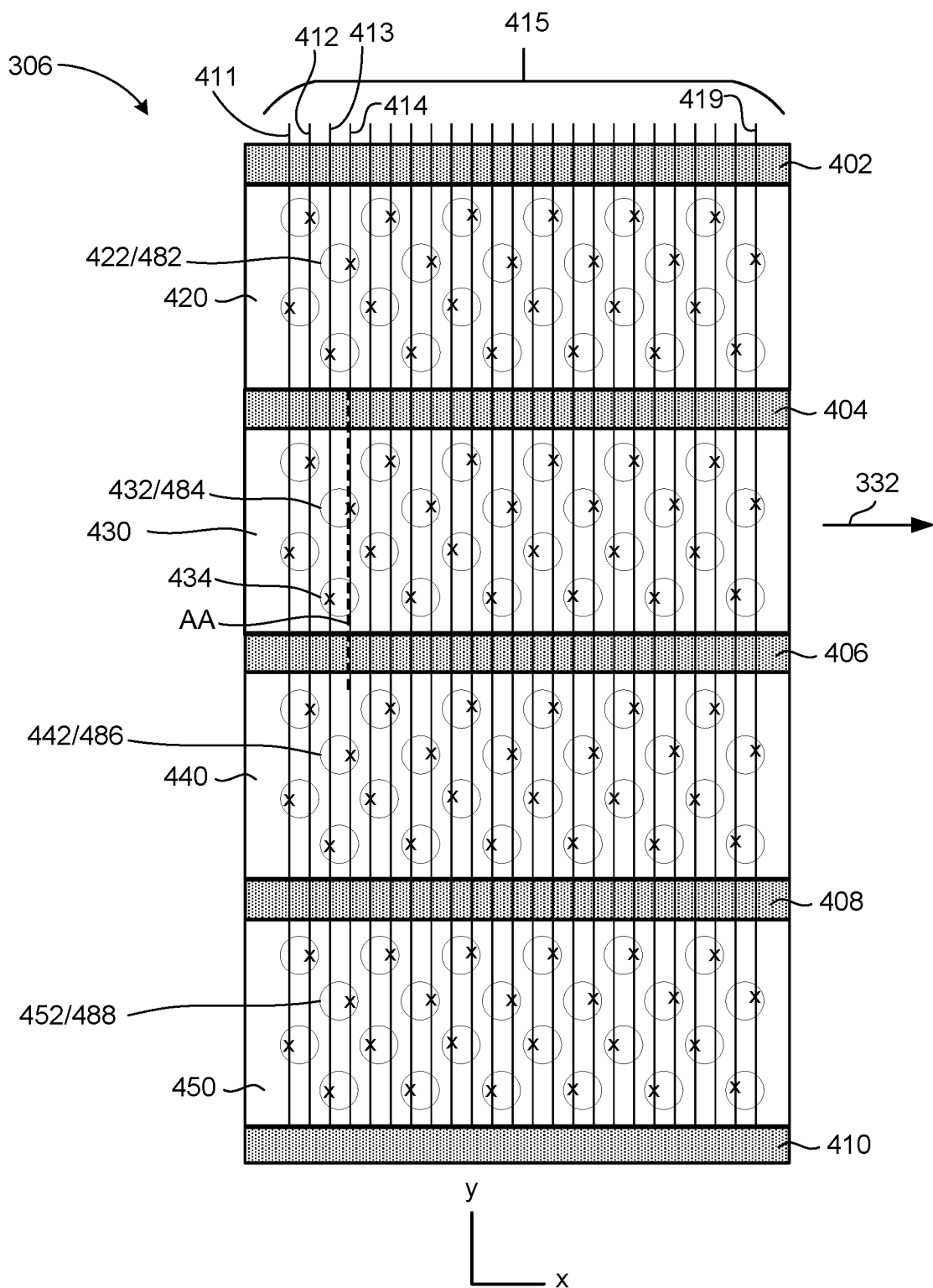
FIG. 4B depicts a top view of a portion of a block of memory cells.

FIGS. 4B-4F depict an example three dimensional ("3D") NAND structure that corresponds to the structure of FIG. 3 and can be used to implement memory structure 326 of FIG. 2. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
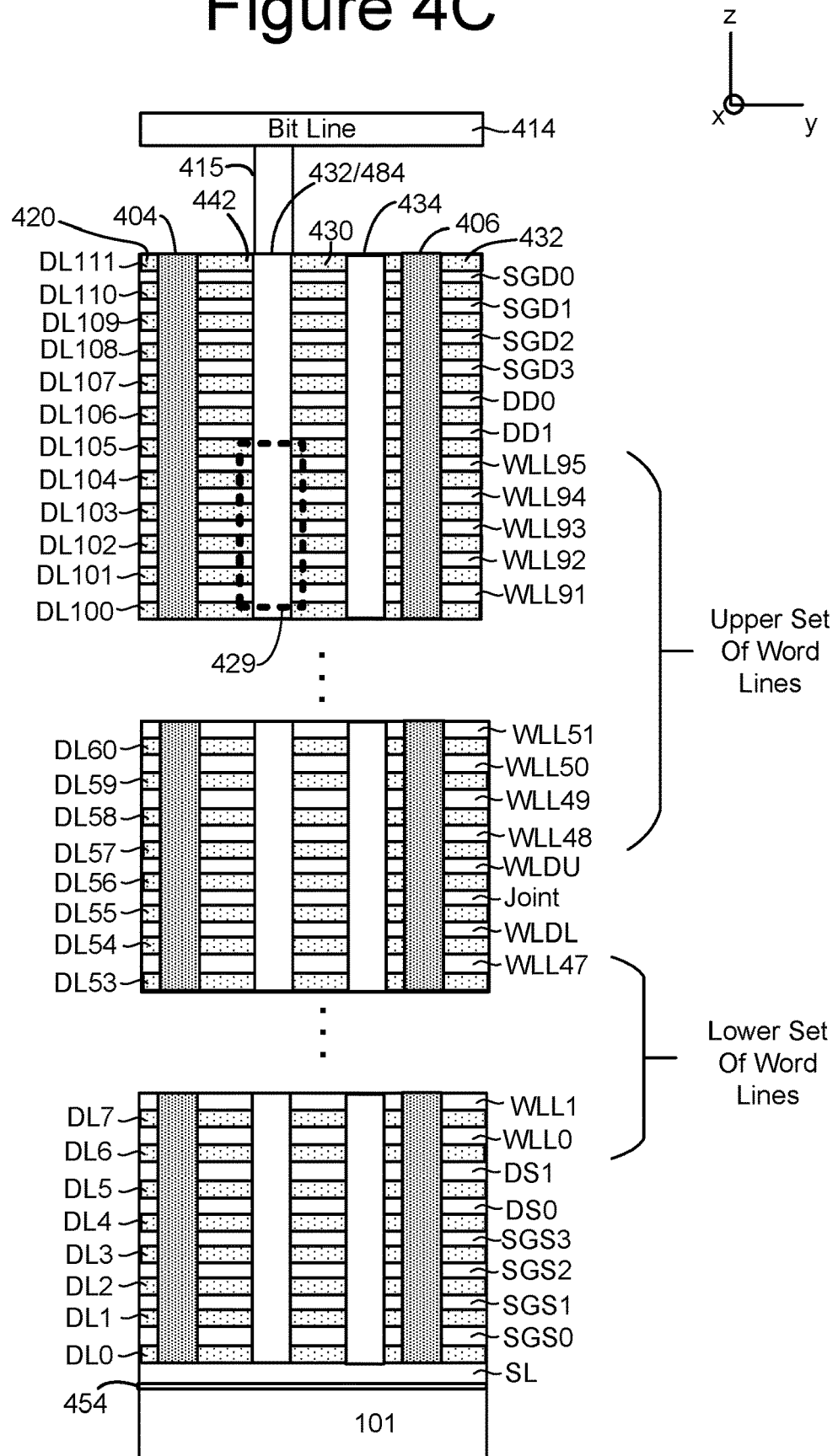
FIG. 4C depicts a cross sectional view of a portion of a block of memory cells.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety six data word line layers WLL0-WLL95 for connecting to data memory cells. Other embodiments can implement more or less than four drain side select layers, more or less than four source side select layers, more or less than six dummy word line layers, and more or less than ninety six word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In one embodiment it is expensive and/or challenging to etch ninety six word line layers intermixed with dielectric layers. To ease this burden, one embodiment includes laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect to the first stack to the second stack. In FIG. 4C, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
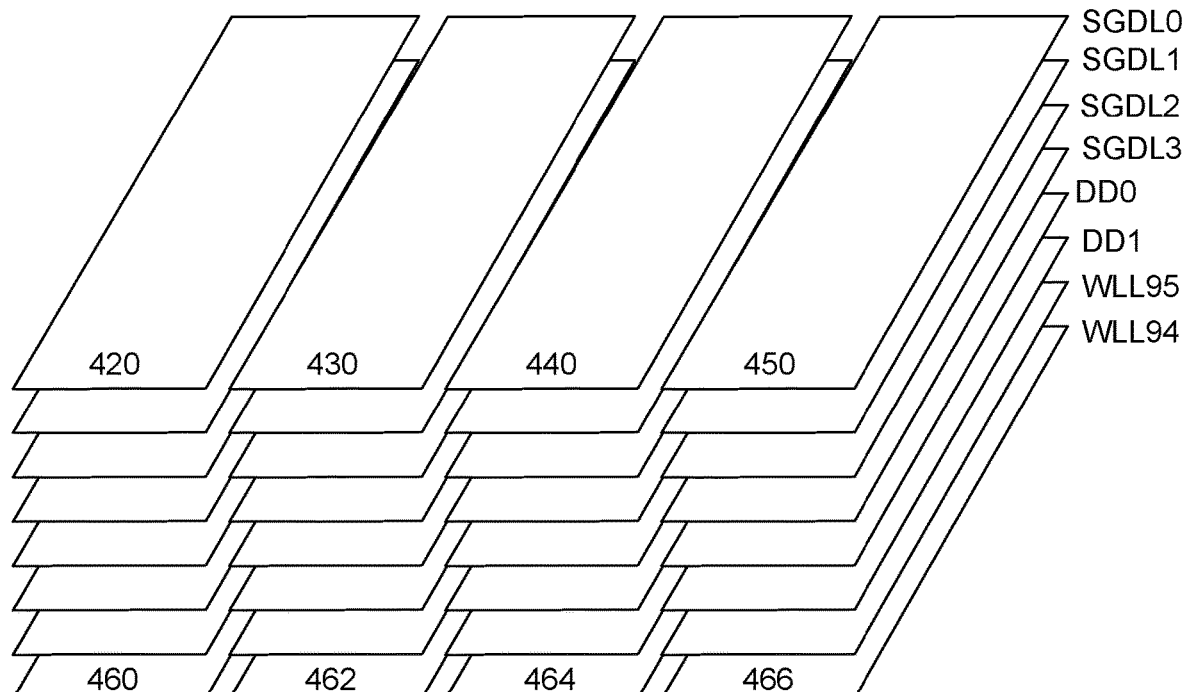
FIG. 4D depicts a view of the select gate layers and word line layers.
Figure 4D:
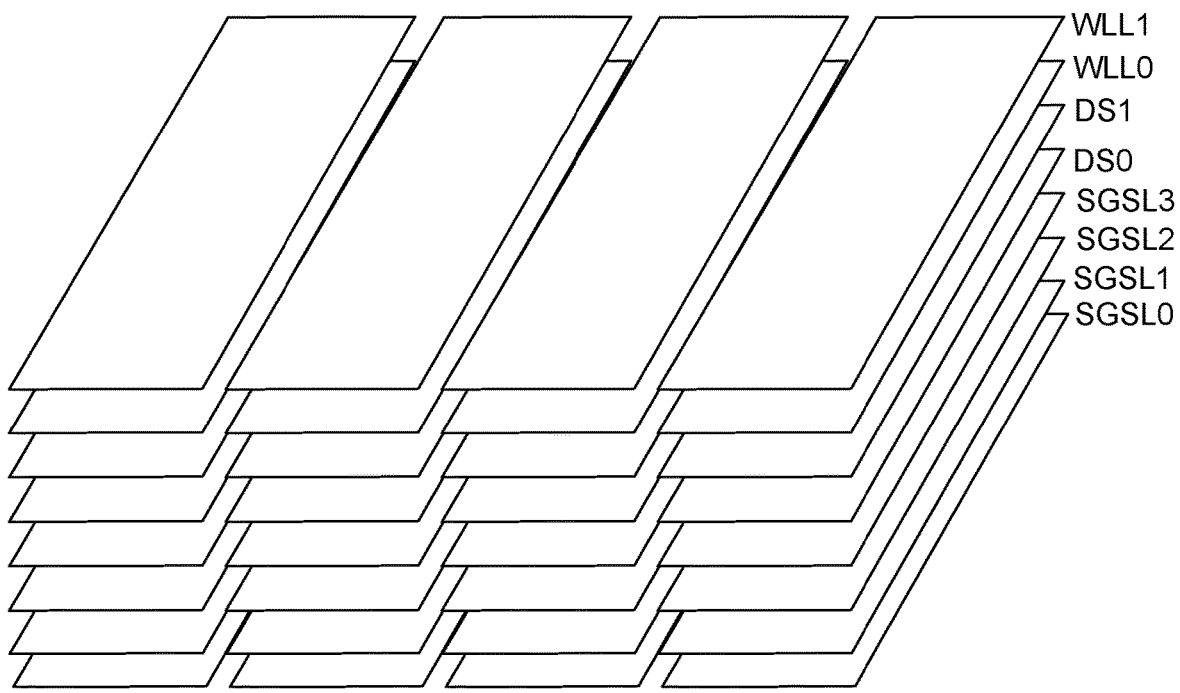

FIG. 4D depicts a logical representation of the conductive layers (SGD0, SGD1, SGD2, SGD3, SGS0, SGS1, SGS2, SGS3, DD0, DD1, DS0, DS1, and WLL0-WLL95) for the block that is partially depicted in FIG. 4C. As mentioned above with respect to FIG. 4B, in one embodiment local interconnects 402, 404, 406, 408 and 410 break up the conductive layers into four regions/fingers (or sub-blocks). For example, word line layer WLL94 is divided into regions 460, 462, 464 and 466. For word line layers (WLL0-WLL127), the regions are referred to as word line fingers; for example, word line layer WLL126 is divided into word line fingers 460, 462, 464 and 466. For example, region 460 is one word line finger on one word line layer. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
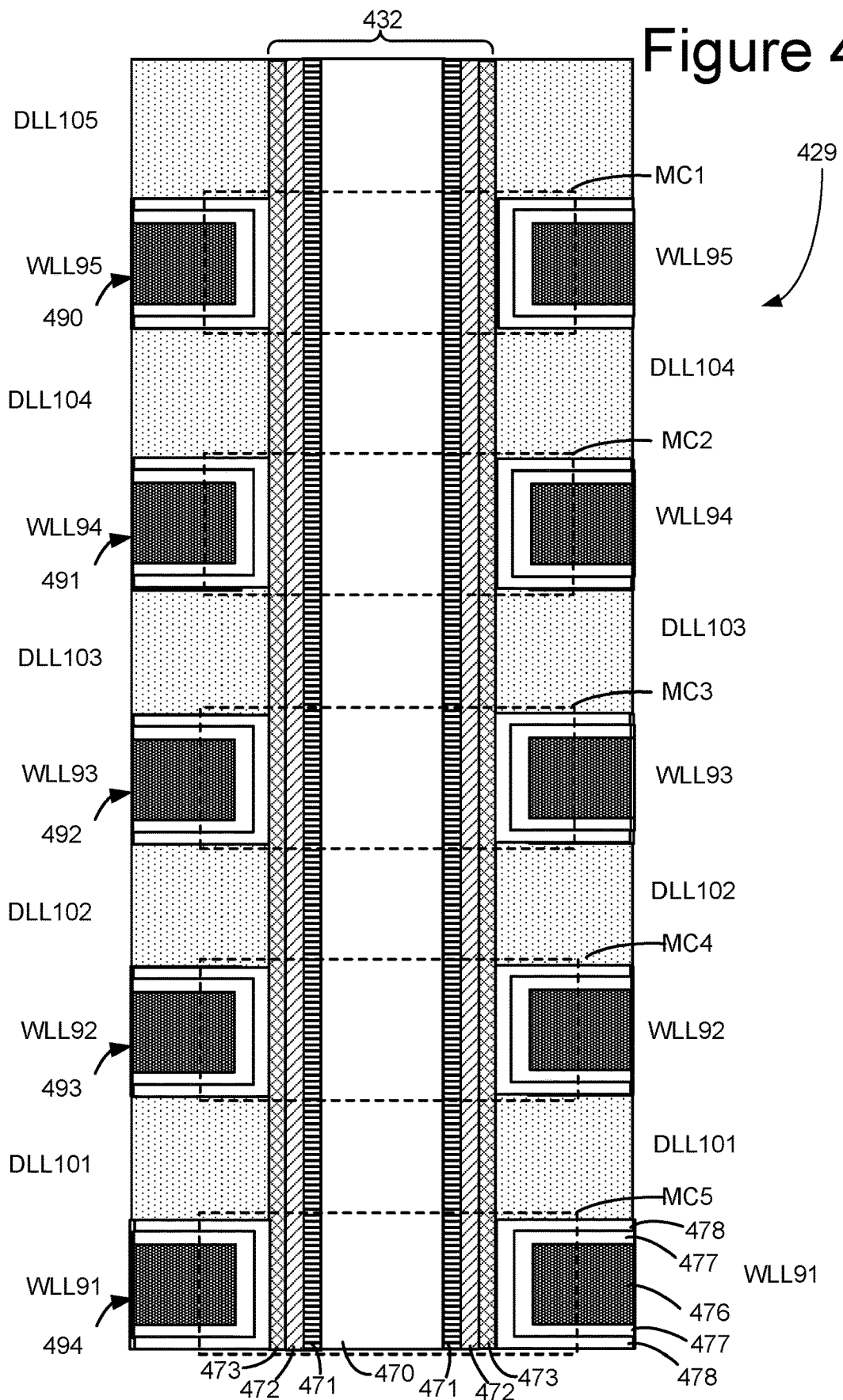
FIG. 4E is a cross sectional view of a vertical column of memory cells.

FIG. 4E depicts a cross sectional view of region 429 of FIG. 4C that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
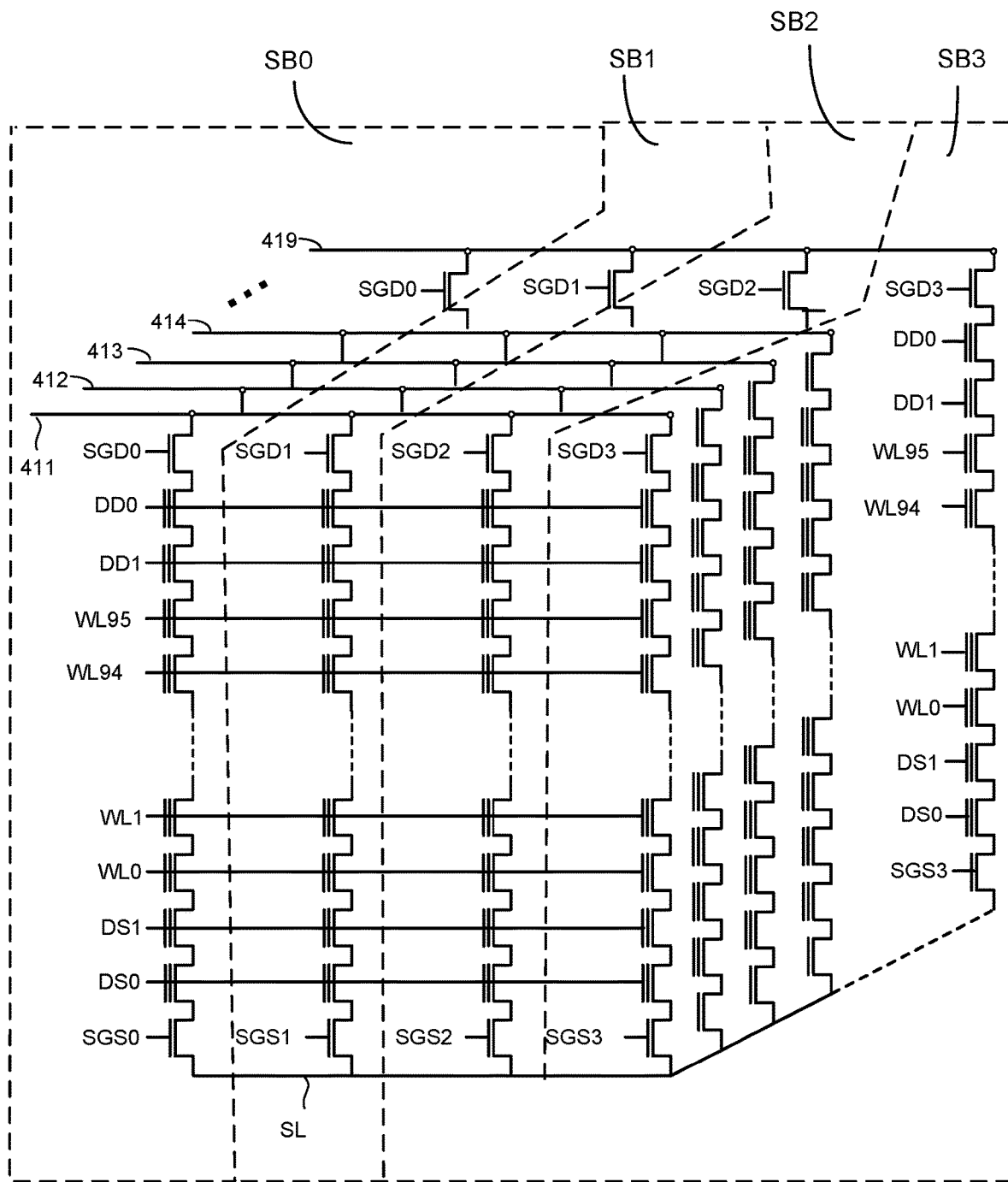
FIG. 4F is a schematic of a plurality of NAND strings showing multiple sub-blocks.

FIG. 4F is a schematic diagram of a portion of the memory depicted in in FIGS. 3-4E. FIG. 4F shows physical word lines WLL0-WLL95 running across the entire block. The structure of FIG. 4F corresponds to portion 306 in Block 2 of FIGS. 4A-E, including bit lines 411, 412, 413, 414, . . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 3-4F is a three dimensional memory structure that includes vertical NAND strings with charge-trapping material, other (2D and 3D) memory structures can also be used with the technology described herein.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate.

FIG. 5 is a graph of threshold voltage versus number of memory cells, and illustrates example threshold voltage distributions for the memory array when each memory cell stores one bit of data. FIG. 5 shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." Memory cells that store one bit of data are referred to as single level cells ("SLC").

FIG. 6 is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). Memory cells that store more than one bit of data are referred to as multi-level cells ("MLC"). FIG. 6 shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed data states. In some embodiments, data states S1-S7 can overlap, with controller 122 relying on error correction to identify the correct data being stored.

FIG. 6 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in. In FIG. 5, read reference voltage Vr is used to test whether memory cells are erased or programmed.

FIG. 6 also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming including (but not limited to) multiple stage/phase programming.

Each threshold voltage distribution (data state) of FIG. 6 corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 7 is a table describing one example of an assignment of data values to data states. In the table of FIG. 6, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 6) or verify operation (e.g. see verify reference voltages Vv1, Vv2, Vv3, Vv4, Vv5, Vv6, and Vv7 of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 8:
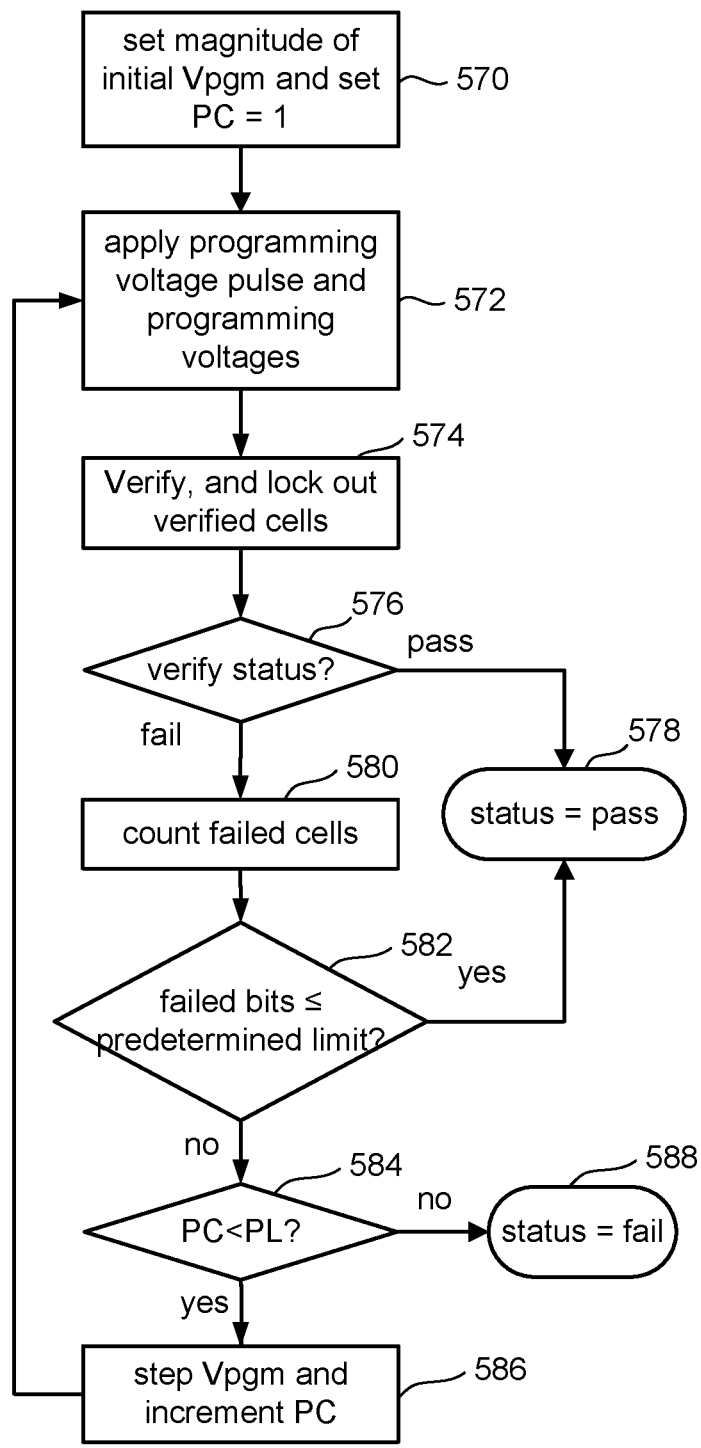
FIG. 8 is a flow chart describing one embodiment of a process for programming non-volatile memory.

FIG. 8 is a flowchart describing one embodiment of a process for programming that is performed by memory die 300. In one example embodiment, the process of FIG. 8 is performed on memory die 300 using the control circuit discussed above, at the direction of state machine 312. The process of FIG. 8 is performed to implement the programming of FIG. 5, the full sequence programming of FIG. 6, or other programming schemes including multi-stage programming. When implementing multi-stage programming, the process of FIG. 8 is used to implement any/each stage of the multi-stage programming process.

Figure 9:
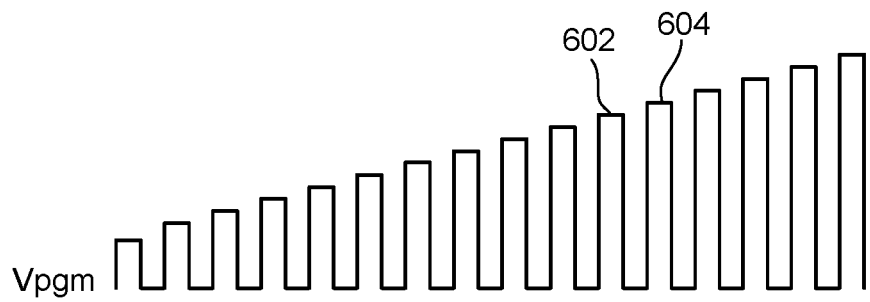
FIG. 9 depicts a series of programming voltage pulses.

Typically, a programming signal Vpgm is applied to the control gates (via a selected word line) during a program operation as a series of programming voltage pulses, as depicted in FIG. 9. Between programming pulses are a set of verify pulses to perform verification. In many implementations, the magnitude of the program pulses is increased with each successive pulse by a predetermined step size (e.g., 0.2v-0.5v). In step 570 of FIG. 8, the programming voltage (Vpgm) is initialized to the starting magnitude (e.g., ~12-16V or another suitable level) and a program counter PC maintained by state machine 312 is initialized at 1. In step 572, a program pulse of the programming signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. In one embodiment, if a memory cell should be programmed, then the corresponding bit line is grounded. On the other hand, if the memory cell should remain at its current threshold voltage, then the corresponding bit line is connected to Vdd (e.g., 1-3.5 volts) to inhibit programming. In step 572, the programming voltage pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 574, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 576, it is determined whether all the memory cells have reached their target threshold voltages (pass). If so, the programming process is complete and successful because all selected memory cells were programmed and verified to their target states. A status of "PASS" (or success) is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of memory cells that have, so far, failed the verify process. This counting can be done by the state machine 312, the controller 120, or other logic. In one implementation, each of the sense blocks will store the status (pass/fail) of their respective memory cells. In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is a number of bits that can be corrected by error correction codes (ECC) during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to one or more thresholds in step 582.

In one embodiment, the predetermined limit can be less than the total number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 584 and the program counter PC is checked against the program limit value (PL). Examples of program limit values include 6, 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line so that another iteration (steps 572-586) of the programming process of FIG. 8 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, controller 102 receives host data (also referred to as user data or data from an entity external to the memory system), also referred to as information bits, that is to be stored non-volatile memory structure 326. The informational bits are represented by the matrix i=[1 0] (note that two bits are used for example purposes only, and many embodiments have code words longer than two bits). An error correction coding process (such as any of the processes mentioned above or below) is implemented by ECC engine 158 of controller 120 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied (e.g., by ECC engine 158) to multiple pages encoded across a number of storage elements, but they do not need to be applied across multiple pages. The data bits can be mapped to a logical page and stored in memory structure 326 by programming one or more memory cells to one or more programming states, which corresponds to v.

In one embodiment, programming serves to raise the threshold voltage of the memory cells to one of the programmed data states S1-S7. Erasing serves to lower the threshold voltage of the memory cells to the Erase data state S0.

One technique to erase memory cells in some memory devices is to bias a p-well (or other types of) substrate to a high voltage to charge up a NAND channel. An erase enable voltage is applied to control gates of memory cells while the NAND channel is at a high voltage to erase the non-volatile storage elements (memory cells). Another approach to erasing memory cells is to generate gate induced drain leakage (GIDL) current to charge up the NAND string channel. An erase enable voltage is applied to control gates of the memory cells, while maintaining the string channel potential to erase the memory cells.

In one embodiment, the GIDL current is generated by causing a drain-to-gate voltage at a select transistor. A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to a bit line to generate a first GIDL current. A second GIDL voltage may be created between two terminals of a select transistor (e.g., source side select transistor) that is connected to a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 10:
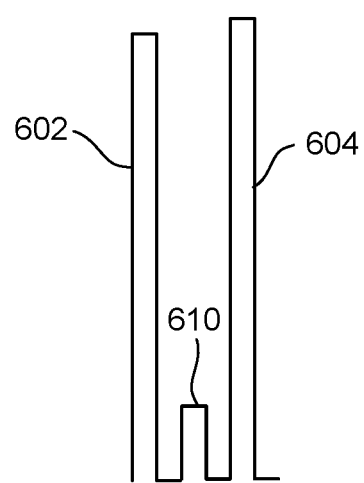
FIG. 10 depicts a two programming voltage pulses and a verify voltage pulse.
Figure 11:
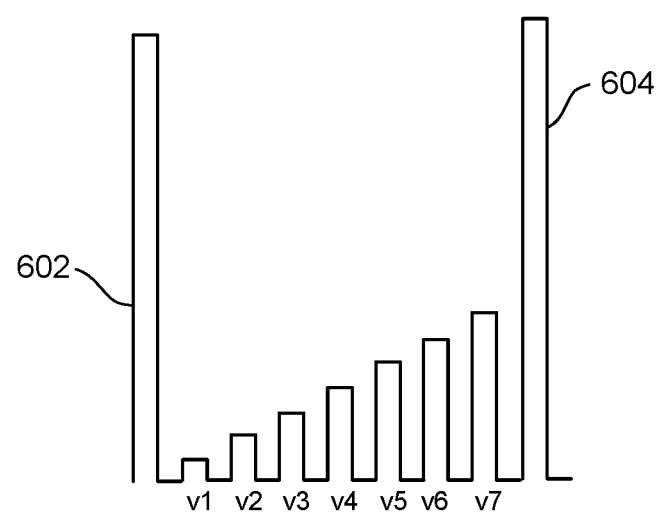
FIG. 11 depicts a two programming voltage pulses and a set of verify voltage pulses.

As discussed above, FIG. 9 depicts the programming signal Vpgm as a series of programming voltage pulses. These programming voltage pulses are one example of doses of programming applied to a plurality of non-volatile memory cells being programmed to a data state. As described by FIG. 8, the system performs program verification between the doses of programming, as depicted in FIGS. 10 and 11. FIG. 10, which illustrates an embodiment in which memory cells store one bit of data per memory cell, depicts two of the programming voltage pulses 602 and 604 of FIG. 9. Between programming voltage pulses 602 and 604 is verify voltage pulse 610. In one embodiment, verify voltage pulse 610 has a magnitude of Vv (see FIG. 5) and represents the system performing program verification (step 574) between the doses of programming (successive iterations of step 572).

FIG. 11, which illustrates an embodiment in which memory cells store three bits of data per memory cell, depicts two of the programming voltage pulses 602 and 604 of FIG. 9. Between programming voltage pulses 602 and 604 are verify voltage pulses v1, v2, v3, v4, v5, v6 and v7. In one embodiment, verify voltage pulse v1 has a magnitude of Vv1 (see FIG. 6), verify voltage pulse v2 has a magnitude of Vv2, verify voltage pulse v3 has a magnitude of Vv3, verify voltage pulse v4 has a magnitude of Vv4, verify voltage pulse v5 has a magnitude of Vv5, verify voltage pulse v6 has a magnitude of Vv6, and verify voltage pulse v7 has a magnitude of Vv7. Verify voltage pulses v1, v2, v3, v4, v5, v6 and v7 represent the system performing program verification (step 574) between the doses of programming (successive iterations of step 572).

Figure 12:
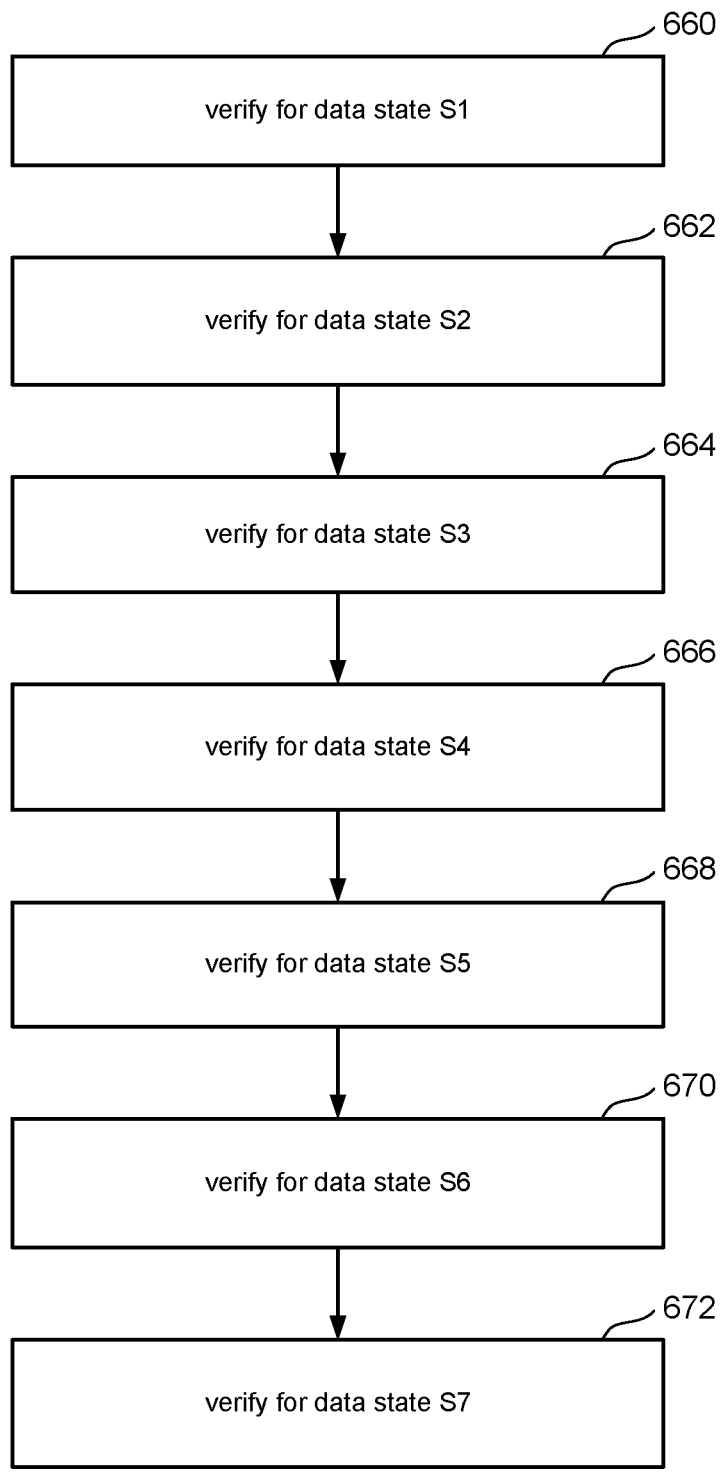
FIG. 12 is a flow chart describing one embodiment of a process for verifying programming of non-volatile memory.

FIG. 12 is a flow chart describing one embodiment of a process for verifying programming of non-volatile memory. That is, the process of FIG. 12 is a process performed during an example implementation of step 574 of FIG. 8 for an embodiment in which memory cells store three bits of data per memory cell. The process of FIG. 12 is performed using the waveforms of FIGS. 9 and 11. In step 660 of FIG. 12, the system performs verification for data state S1. For example, the system tests whether memory cells being programmed to data state S1 have threshold voltages greater than Vv1 (e.g., applying verify voltage pulse v1 of FIG. 11 to the control gates of memory cells being programmed to data state S1).

In step 662, the system performs verification for data state S2. For example, the system tests whether memory cells being programmed to data state S2 have threshold voltages greater than Vv2 (e.g., applying verify voltage pulse v2 of FIG. 11 to the control gates of memory cells being programmed to data state S2).

In step 664, the system performs verification for data state S3. For example, the system tests whether memory cells being programmed to data state S3 have threshold voltages greater than Vv3 (e.g., applying verify voltage pulse v3 of FIG. 11 to the control gates of memory cells being programmed to data state S3).

In step 666, the system performs verification for data state S4. For example, the system tests whether memory cells being programmed to data state S4 have threshold voltages greater than Vv4 (e.g., applying verify voltage pulses v4 of FIG. 11 to the control gates of memory cells being programmed to data state S4).

In step 668, the system performs verification for data state S5. For example, the system tests whether memory cells being programmed to data state S5 have threshold voltages greater than Vv5 (e.g., applying verify voltage pulses v5 of FIG. 11 to the control gates of memory cells being programmed to data state S5).

In step 670, the system performs verification for data state S6. For example, the system tests whether memory cells being programmed to data state S6 have threshold voltages greater than Vv6 (e.g., applying verify voltage pulse v6 of FIG. 11 to the control gates of memory cells being programmed to data state S6).

In step 672, the system performs verification for data state S7. For example, the system tests whether memory cells being programmed to data state S7 have threshold voltages greater than Vv7 (e.g., applying verify voltage pulse v7 of FIG. 11 to the control gates of memory cells being programmed to data state S7). Note that, in one embodiment, steps 660-672 are performed between doses of programming (e.g., between programming voltage pulses). In some embodiments, one or more of steps 660-672 can be skipped between certain programming voltage pulses. In one embodiment, steps 660-672 are performed sequentially (in any order or in the order depicted), while in other embodiments steps 660-672 are performed in parallel (e.g., concurrently).

One means of verifying the programming is to test conduction at a specific compare point (e.g., verify reference voltage). The memory cells that are verified to be sufficiently programmed are locked out, for example, by raising the bit line voltage from 0 to Vdd to stop the programming process for those memory cells. For example, FIG. 13A depicts graphs of threshold voltage (Vth) versus time and bit line voltage (Vbl) versus time. While a memory cell is receiving the program voltage Vpgm of FIG. 9 at its control gate, the threshold voltage of the memory cell increases. When the threshold voltage of the memory cell reaches the verify reference voltage Vver (e.g. any of Vv, Vv1, Vv2, Vv3, Vv4, Vv5, Vv6, and Vv7 of FIGS. 5 & 6, as appropriate)), then the bit line voltage is raised to Vinhibit (e.g. Vdd).

When programming and verifying as depicted in FIG. 13A, there is a tradeoff between speed of programming and precision of programming. The precision of programming is related to the distribution of threshold voltages of the programmed memory cells subsequent to the programming process. The tighter the threshold voltage distribution, the easier it is to unambiguously read the memory cells. The need for tight threshold voltage distributions is even more important with multi-level memory cells storing multiple bits of data because the read process needs to unambiguously distinguish between the different threshold voltage distributions (e.g., for data states S1-S7). To obtain a tight threshold voltage distribution, a smaller step size can be used for the program voltage Vpgm. However, using a smaller step size slows down the programming process.

Figure 13B:
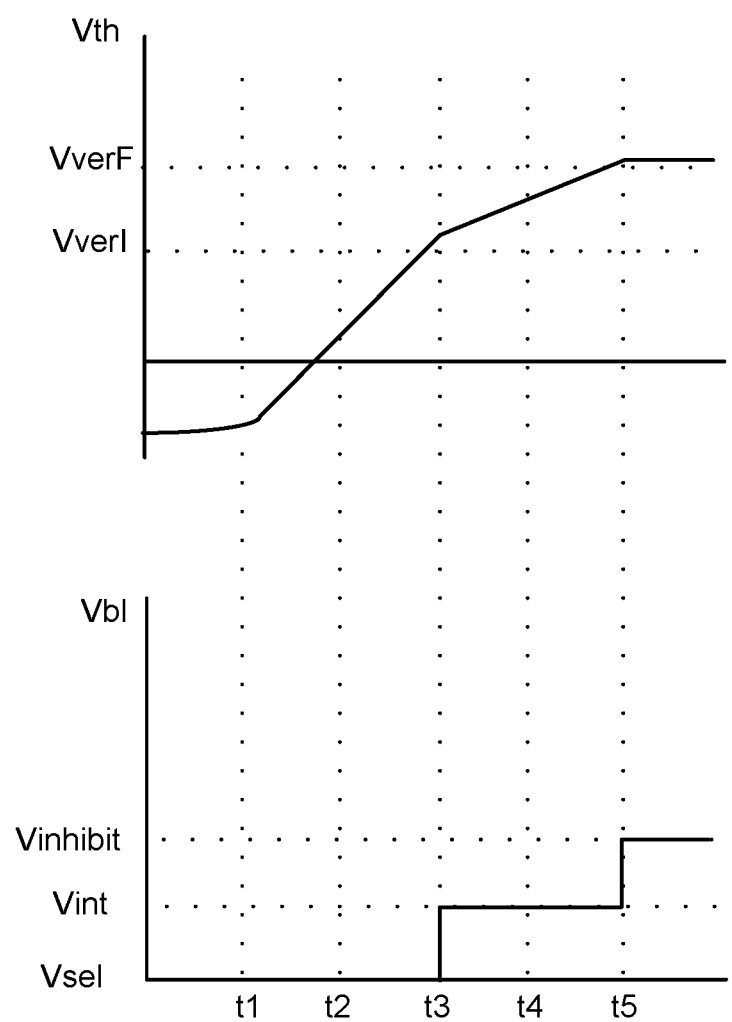
FIG. 13B is a graph describing the bit line voltage during a programming process.

An improvement to the programming process is depicted in FIG. 13B, which can be referred to as a coarse/fine programming process. The process of FIG. 13B applies the program voltage signal Vpgm of FIG. 9 to the control gates of the memory cells to be programmed. Between the programming voltage pulses, verify operations are performed. If the threshold voltage of the memory cell being programmed is less than an intermediate verify reference voltage VverI, the programming continues for that memory cell with the bit line voltage remaining low (e.g. 0 volts). This is the coarse phase of the coarse/fine programming process because the memory cells program faster. If the threshold voltage of the memory cell being programmed is higher than intermediate verify reference voltage VverI and lower than final verify reference voltage VverF, then an intermediate bit line voltage (e.g. 0.5-1.0 volts) is applied. As a result of the intermediate bit line voltage, the channel voltage for the memory cell will increase and the programming of that memory cell will be slowed down because the shift in threshold voltage due to each programming voltage pulse will be reduced. This is the fine phase of the coarse/fine programming process. The bit line will remain at the intermediate bit line voltage for a number of programming voltage pulses until the threshold voltage of the memory cell reaches the final verify reference voltage VverF. When the memory cell's threshold voltage reaches final verify reference voltage VverF, the bit line will be raised to inhibit further programming (e.g. by raising the bit line voltage to Vinhibit (e.g., Vdd, which can be 1-5 volts). Note that the final verify reference voltage VverF corresponds to the verify reference voltage for the data state that the memory cells are being programmed to. For example, during step 660 (see FIG. 12), final verify reference voltage VverF corresponds to Vv1; during step 662, final verify reference voltage VverF corresponds to Vv2; during step 664, final verify reference voltage VverF corresponds to Vv3; during step 666, final verify reference voltage VverF corresponds to Vv4; during step 668, final verify reference voltage VverF corresponds to Vv5; during step 670, final verify reference voltage VverF corresponds to Vv6; and during step 672, final verify reference voltage VverF corresponds to Vv7. In one embodiment, the intermediate verify reference voltage VverI for a data state is 0.25 volts below the final verify reference voltage VverF for the data state. Other magnitudes of separation between VverI and VverF for a data state can also be used.

Using the approach of FIG. 13B results in the programmed threshold voltage distribution being narrower than the process of FIG. 13A because the shift per program pulse of the threshold voltage is reduced once the threshold voltage is close to the target value (e.g. when the threshold voltage is above VverI and below VverF). However, the approach of FIG. 13B slows down the programming process because each data state being verified now requires two verification operations. To reduce the number of verify operations performed (and, therefore, speed up the programming process), a system is proposed for skipping verification at VverF for some programming voltage pulses and skipping verification at VverI for some programming voltage pulses. More details are provided below.

Figure 14:
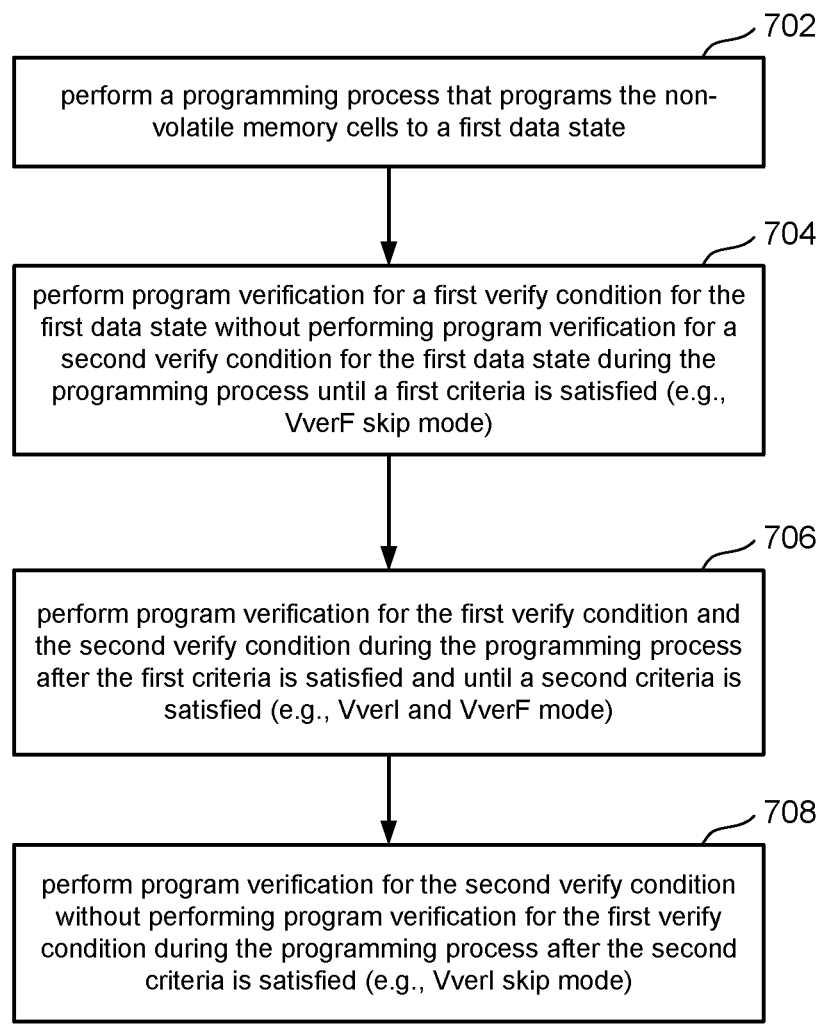
FIG. 14 depicts is a flow chart describing one embodiment of a process for programming and verifying programming of non-volatile memory.

FIG. 14 depicts is a flow chart describing one embodiment of a process for programming and verifying programming of non-volatile memory that includes skipping verification at VverF (or another verify condition) for some programming voltage pulses (or other doses of programming) and skipping verification at VverI (or another verify condition) for some programming voltage pulses (or other doses of programming). The process of FIG. 14 is performed by the control circuit (discussed above) connected to a plurality of non-volatile memory cells. For example, the process of FIG. 14 can be performed at the direction of state machine 312 (which is connected to memory structure 326).

In step 702 of FIG. 14, the control circuit performs a programming process that programs a plurality of non-volatile memory cells to a first data state. For example, the process of FIG. 8 can be used to program memory cells to the programmed data state P of FIG. 5 or to one or more of the data states S1-S7 of FIG. 6 (where the first data state can refer to any of S1-S6). In some embodiments, step 702 includes applying the programming voltage pulses of FIG. 9. In step 704, the control circuit performs program verification for a first verify condition for the first data state without performing program verification for a second verify condition for the first data state during the programming process until a first criteria is satisfied. In some embodiments, step 704 includes performing step 574 of FIG. 8 one or multiple times. One example of the first verify condition is the memory cells being programmed having a threshold voltage greater than or equal to the intermediate verify reference voltage VverI for the first data state. One example of the second verify condition is the memory cells being programmed having a threshold voltage greater than or equal to the final verify reference voltage VverF for the first data state. Therefore, one example of step 704 includes testing whether the memory cells being programmed to the first data state have a threshold voltage greater than or equal to the intermediate verify reference voltage VverI for the first data state without testing whether the memory cells being programmed to the first data state have a threshold voltage greater than or equal to the final verify reference voltage VverF for the first data state. In step 706, the control circuit performs program verification for the first verify condition and the second verify condition during the programming process after the first criteria is satisfied and until a second criteria is satisfied. In some embodiments, step 706 includes performing step 574 of FIG. 8 one or multiple times. In step 708, the control circuit performs program verification for the second verify condition without performing program verification for the first verify condition during the programming process after the second criteria is satisfied. In some embodiments, step 708 includes performing step 574 of FIG. 8 one or multiple times.

In some example implementations, step 704 is referred to as VverF skip mode because the system skips verification the final verify reference voltage VverF for the first data state. In some example implementations, step 706 is referred to as VverI and VverF mode because the system performs verification VverI and VverF for the first data state. In some example implementations, step 708 is referred to as VverI skip mode because the system skips verification the intermediate verify reference voltage VverI for the first data state. When performing the process of FIG. 8, each iteration of the loop that includes steps 572-586 will be in one of VverF skip mode, VverI and VverF mode or VverI skip mode. That is, each time step 574 is performed, one of steps 704, 706 or 708 will be performed. Consider an example in which twelve programming voltage pulses are used to successfully program the memory cells; therefore, the loop that includes steps 572-586 will be performed twelve times. Perhaps (as an example), the first eight times that the loop that includes steps 572-586 is performed will be VverF skip mode; therefore, each time step 574 is performed during those twelve loops step 574 is implemented as step 704 of FIG. 14. For example purposes, the ninth and tenth loops will be VverI and VverF mode; therefore, each time step 574 is performed during those two loops step 574 is implemented as step 706 of FIG. 14. For example purposes, the eleventh and twelfth loops will be VverI skip mode; therefore, each time step 574 is performed during the final two loops step 574 is implemented as step 708 of FIG. 14.

Figure 15:
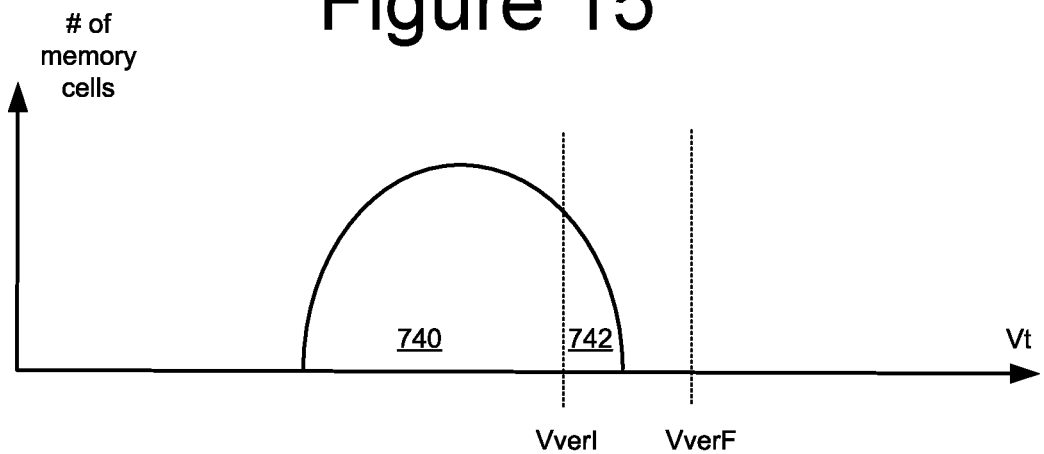
FIG. 15 is a graph of a threshold voltage distribution for a set of non-volatile memory cells being programmed.
Figure 16:
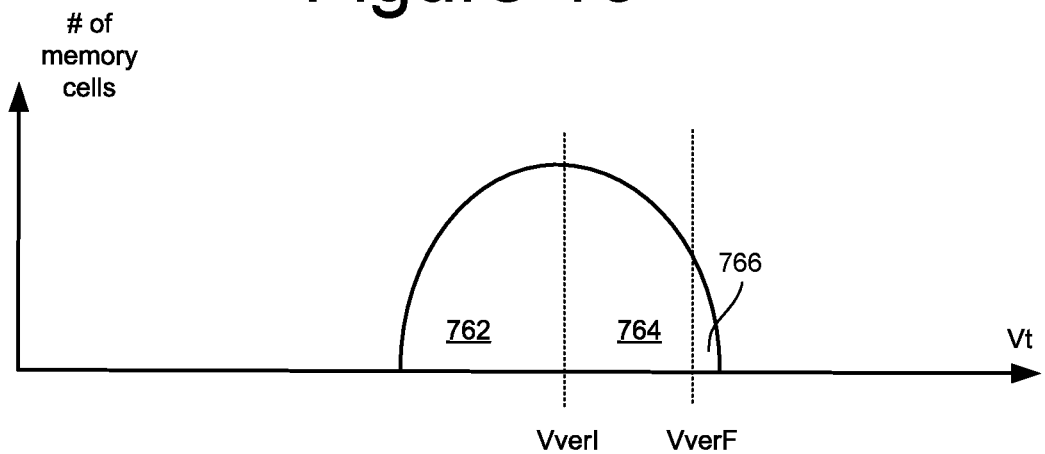
FIG. 16 is a graph of a threshold voltage distribution for a set of non-volatile memory cells being programmed.
Figure 17:
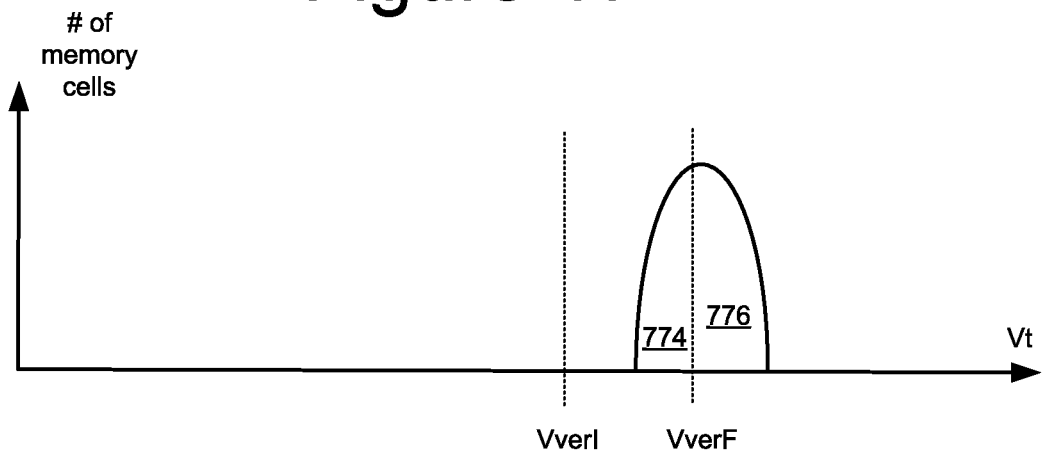
FIG. 17 is a graph of a threshold voltage distribution for a set of non-volatile memory cells being programmed.

In one embodiment, described by FIGS. 15-17, the first criteria is satisfied when a threshold number of the non-volatile memory cells have reached the first verify condition and the second criteria is satisfied when a threshold number of the non-volatile memory cells have reached the second verify condition. FIG. 15 shows the threshold voltage distribution for the memory cells being programmed to the first data state in VverF skip mode (when the system is testing for VverI but not for VverF). A portion 740 of the threshold voltage distribution represents memory cells that have threshold voltages below VverI for the first data state. A portion 742 of the threshold voltage distribution represents memory cells that have threshold voltages greater than VverI for the first data state, but less than VverF for the first data state. No memory cells have threshold voltages greater than VverF for the first data state. When performing the verify operation (testing whether threshold voltages are greater than or equal to VverI for the first data state), those memory cells being programmed to the first data state that have a threshold voltage less than VverI for the first data state will have their bit lines remain at Vss (e.g., 0 volts) for the next programming voltage pulse and those memory cells being programmed to the first data state that have a threshold voltage greater than or equal to VverI for the first data state will have their bit lines raised to Vint (e.g., 0.5 volts) for the next programming voltage pulse. If the number of memory cells that have a threshold voltage greater than or equal to VverI for the first data state is greater than a first predetermined number, then the set of memory cells being programmed to the first data state move to VverI and VverF mode. In one example, the first predetermined number is 0.02% of all memory cells being programmed, 0.2% of memory cells being programmed to the first data state, or another amount of memory cells.

FIG. 16 shows the threshold voltage distribution for the memory cells being programmed to the first data state in VverI and VverF mode (when the system is testing for VverI and for VverF). A portion 762 of the threshold voltage distribution represents memory cells that have threshold voltages below VverI for the first data state. A portion 764 of the threshold voltage distribution represents memory cells that have threshold voltages greater VverI for the first data state, but less than VverF for the first data state. A portion 766 of the threshold voltage distribution represents memory cells that have threshold voltages greater than VverF for the first data state. When performing the verify operation, those memory cells being programmed to the first data state that have a threshold voltage less than VverI for the first data state will have their bit lines remain at Vss (e.g., 0 volts) for the next programming voltage pulse and), those memory cells being programmed to the first data state that have a threshold voltage greater than or equal to VverI for the first data state will have their bit lines raised to Vint (e.g., 0.5-1.0 volts) for the next programming voltage pulse, and those memory cells being programmed to the first data state that have a threshold voltage greater than or equal to VverF for the first data state will have their bit lines raised to Vinhibit (e.g., 1.0-5.0 volts) for the next programming voltage pulse. If the number of memory cells that have a threshold voltage greater than or equal to VverF for the first data state is greater than a second predetermined number, then the set of memory cells being programmed to the first data state move to VverI skip mode. In one example, the second predetermined number is 0.02% of all memory cells being programmed, 0.2% of memory cells being programmed to the first data state, or another amount of memory cells.

In some embodiments, testing for threshold voltages greater than or equal to VverI includes applying a first voltage pulse at VverI, and testing for threshold voltages greater than or equal to VverF includes applying a second voltage pulse at VverF. In other embodiments, the system can test for VverI and VverF with one voltage pulse but using two different sense times. For example, the system can apply a voltage pulse, sense whether the memory cells turned on after 0.7 micro seconds for VverI and sense whether the memory cells turned on after 1.4 micro seconds for VverF.

FIG. 17 shows the threshold voltage distribution for the memory cells being programmed to the first data state in VverI skip mode (when the system is testing for VverF but not for VverI). A portion 774 of the threshold voltage distribution represents memory cells that have threshold voltages greater VverI for the first data state, but less than VverF for the first data state. A portion 776 of the threshold voltage distribution represents memory cells that have threshold voltages greater than VverF for the first data state. In some embodiments, it is possible to be in VverI skip mode and have some memory cells with threshold voltages below VverI. When performing the verify operation, those memory cells being programmed to the first data state that have a threshold voltage greater than or equal to VverI for the first data state and less than VverF for the first data state will have their bit lines raised to Vint for the next programming voltage pulse, and those memory cells being programmed to the first data state that have a threshold voltage greater than or equal to VverF for the first data state will have their bit lines raised to Vinhibit for the next programming voltage pulse.

Figure 18:
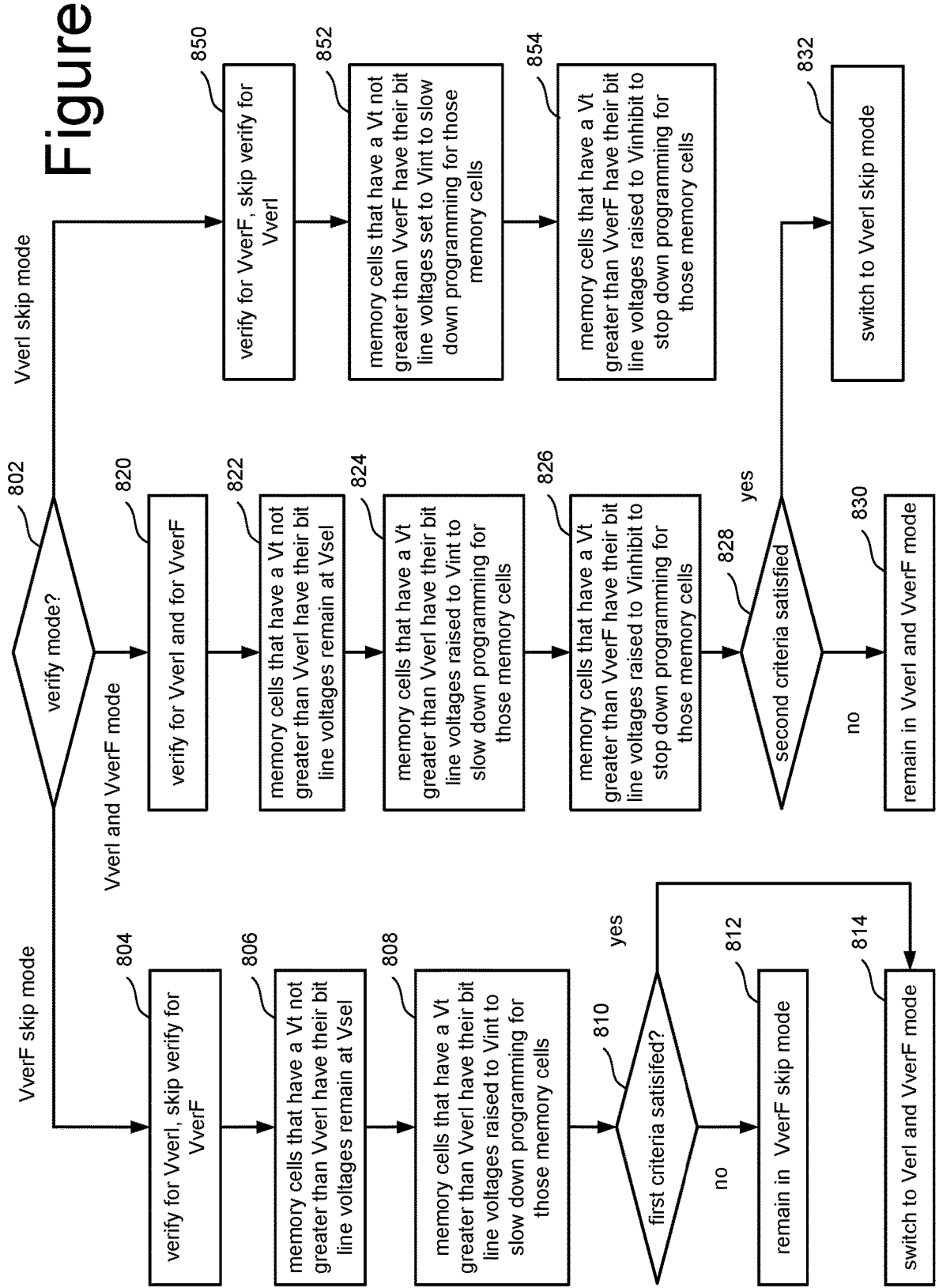
FIG. 18 depicts is a flow chart describing one embodiment of a process performed when verifying programming of non-volatile memory.

FIG. 18 depicts a flow chart describing one embodiment of a process performed when verifying programming of non-volatile memory. The process of FIG. 18 is performed by the control circuit (discussed above) connected to a plurality of non-volatile memory cells. For example, the process of FIG. 18 can be performed at the direction of state machine 312 (which is connected to memory structure 326). In one embodiment, the process of FIG. 18 is performed during step 574 of FIG. 8 such that during each iteration of step 574 the process of FIG. 18 is performed once for each data state (or once for each of a subset of data states) that the memory cells are being programmed to. For example, the process of FIG. 18 can be performed during each of steps 660-672 of FIG. 12. Therefore, the process of FIG. 18 comprises performing program verification between the doses of programming (e.g., one example of the doses of programming are the programming voltage pulses of FIG. 9), where the doses of programming are applied during each iteration of step 572 of FIG. 8.

As mentioned above, in one embodiment the system can operate in at least three verify modes: VverF skip mode, VverI and VverF mode and VverI skip mode. Step 802 of FIG. 18 includes determining which of those three verify modes the system is currently in for the particular data state being verified. If the system is currently in VverF skip mode for the particular data state being verified, then the process continues at step 804, which includes verifying the plurality of non-volatile memory cells for a first verify condition (e.g., VverI) for the first data state while skipping verifying the plurality of non-volatile memory cells for a second verify condition (e.g., VverF) for the first data state. In step 806, memory cells that have a threshold voltage (Vt) not greater than VverI have their bit line voltages remain at Vsel (e.g., 0 volts) for the next dose of programming. In step 808, memory cells that have a threshold voltage greater than VverI have their bit line voltages raised to Vint to slow down programming for those memory cells for the next dose of programming.

In step 810, the system determines whether the first criteria is satisfied. In one embodiment, the system determines whether an amount of memory cells that have satisfied the first verify condition meets the first criteria; for example, whether the number of memory cells having a threshold voltage greater than VverI is greater than the first predetermined number (mentioned above). That is, in one example implementation, the first criteria is satisfied when a threshold number of the plurality of non-volatile memory cells have reached the first verify condition. If the first criteria is not satisfied, then in step 812 the system will remain in VverF skip mode for the particular data state being verified during the next dose of programming. If the first criteria is satisfied, then in step 814 the system will switch to VverI and VverF mode for the particular data state being verified during the next dose of programming.

If (in step 802) the system is currently in VverI and VverF mode for the particular data state being verified, then the process continues at step 820, which includes (e.g., in response to determining that an amount of memory cells that have satisfied the first verify condition meet the first criteria) verifying the plurality of non-volatile memory cells for the first verify condition (e.g., VverI) for the data state and verifying the plurality of non-volatile memory cells for the second verify condition (e.g., VverF) for the particular data state being verified. In step 822, memory cells that have a threshold voltage not greater than VverI have their bit line voltages remain at Vsel for the next dose of programming. In step 824, memory cells that have a threshold voltage greater than the first verify condition (e.g., VverI) have their bit line voltages raised to Vint to slow down programming for those memory cells for the next dose of programming. In step 826, memory cells that have a threshold voltage greater than the second verify condition (e.g., VverF) have their bit line voltages raised to Vinhibit to stop programming for those memory cells. In step 828, the system determines whether the second criteria is satisfied. If the second criteria is not satisfied, then in step 830 the system will remain in VverI and VverF mode for the particular data state being verified during the next dose of programming. If the second criteria is satisfied, then in step 832 the system will switch to VverI skip mode for the particular data state being verified during the next dose of programming.

If (in step 802) the system is currently in VverI skip mode for the particular data state being verified, then the process continues at step 850, which includes (e.g., in response to determining that the second criteria is satisfied) verifying the plurality of non-volatile memory cells for the second verify condition (e.g., VverF) for the particular data state being verified while skipping verifying the plurality of non-volatile memory cells for the first verify condition (e.g., VverI) for the particular data state being verified. In step 852, memory cells that have a threshold voltage that is not greater than the second verify condition (e.g., VverF) have their bit line voltages set to Vint to slow down programming for those memory cells for the next dose of programming. In step 854, memory cells that have a threshold voltage greater than second verify condition (e.g., VverF) have their bit line voltages raised to Vinhibit to stop programming for those memory cells.

There are many different tests that can be used to determine whether the second criteria is satisfied (step 828). In some embodiments, the second criteria is other than an amount of the plurality of memory cells reaching the first verify condition (e.g., VverI). In one embodiment, the second criteria is satisfied when a threshold number of the plurality of non-volatile memory cells have reached the second verify condition (e.g., VverF). As mentioned above, in one example implementation the second criteria is satisfied when 0.02% of all memory cells being programmed to this particular state have reached the second verify condition (e.g., VverF). In another embodiment, the second criteria is satisfied after a predetermined number of doses of programming have been applied to the plurality of non-volatile memory after the first criteria is satisfied. For example, a device parameter for the memory die can be set to indicate a number of programming voltage pulses to apply in VverI and VverF mode such that after that indicated number of programming voltage pulses are applied while in VverI and VverF mode the system automatically switches to VverI skip mode. One example of a device parameter that can be used to indicate the number of programming voltage pulses to apply in VverI and VverF mode is the Skip Parameter SP (see FIG. 2). The Skip Parameter SP can be set at the time of manufacturing or by a user in the field.

Figure 19:
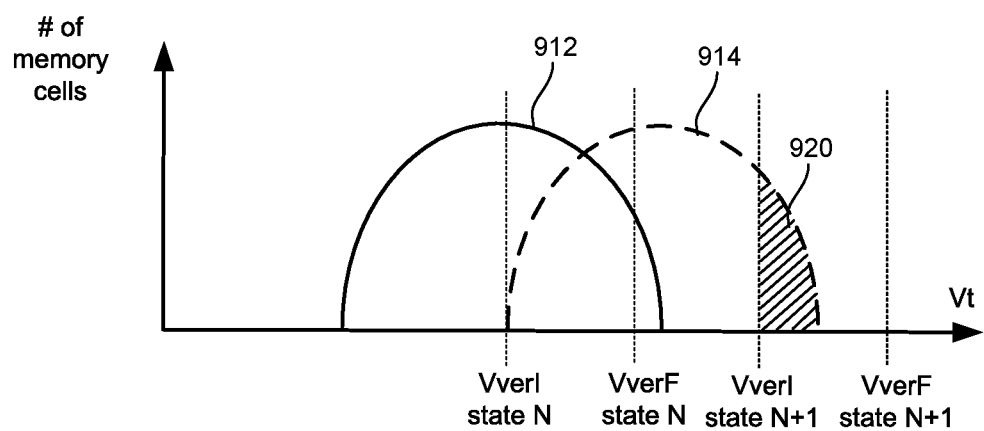
FIG. 19 is a graph of two threshold voltage distributions for a set of non-volatile memory cells being programmed.

In another embodiment, the second criteria is satisfied based on performance of memory cells being programmed to a different data state than the particular data state being verified. In this embodiment, the memory cells store multiple bits of data per memory cell. The control circuits are configured to program a selected set of non-volatile memory cells to multiple data states. The plurality of non-volatile memory cells being programmed to the particular data state being verified are a first subset of the selected set of non-volatile memory cells being programmed. The control circuit is configured to program a second subset of the selected set of non-volatile memory cells to a second data state. In this embodiment, the second criteria is satisfied when a minimum number of the second subset of the selected set of non-volatile memory cells has reached a target level for the second data state. One example of this condition is depicted in FIG. 19, which shows two threshold voltage distributions 912 and 914. Threshold voltage distribution 912 is for memory cells being programmed to a first data state (state N), and can represent the particular data state being verified in the process of FIG. 18. Threshold voltage distribution 914 is for memory cells being programmed to a second data state (state N+1). In one embodiment, the second data state is adjacent the first data state and has higher threshold voltages (e.g., the first data state is state S4 and the second data state is S5—see FIG. 6). FIG. 19 depicts how each data state has its own first verify condition (e.g., VverI) and its own second verify condition (e.g., VverF). For example, data state N (the target of threshold voltage distribution 912) has VverI state N and VverF state N, while data state N+1 (the target of threshold voltage distribution 914) has VverI state N+1 and VverF state N+1. In this embodiment, the second criteria is satisfied for the memory cells of threshold voltage distribution 912 when a minimum number of the memory cells of threshold voltage distribution 914 has reached VverI state N+1. This minimum number of the memory cells of threshold voltage distribution 914 that have reached VverI state N+1 are depicted in FIG. 19 by region 920 of threshold voltage distribution 914, and (in on example) can be 0.02% of all memory cells being programmed (or another amount).

The above description introduces a system for reducing the time needed for verifying programming. Therefore, the programming process is completed faster.

One embodiment includes a non-volatile storage apparatus, comprising a plurality of non-volatile memory cells and a control circuit connected to the non-volatile memory cells. The control circuit is configured to perform a programming process that programs the non-volatile memory cells to a first data state, perform program verification for a first verify condition for the first data state without performing program verification for a second verify condition for the first data state during the programming process until a first criteria is satisfied, perform program verification for the first verify condition and the second verify condition during the programming process after the first criteria is satisfied and until a second criteria is satisfied, and perform program verification for the second verify condition without performing program verification for the first verify condition during the programming process after the second criteria is satisfied.

One embodiment includes a method for programming non-volatile storage, comprising: applying doses of programming to a plurality of non-volatile memory cells being programmed to a first data state and performing program verification between the doses of programming. The performing program verification comprises: verifying the plurality of non-volatile memory cells for a first verify condition for the first data state while skipping verifying the plurality of non-volatile memory cells for a second verify condition for the first data state, determining that an amount of memory cells that have satisfied the first verify condition meets a first criteria, in response to determining that an amount of memory cells that have satisfied the first verify condition meets the first criteria, verifying the plurality of non-volatile memory cells for the first verify condition for the data state and verifying the plurality of non-volatile memory cells for the second verify condition for the data state, determining that second criteria is satisfied, and in response to determining that an amount of memory cells that second criteria is satisfied, verifying the plurality of non-volatile memory cells for the second verify condition for the data state while skipping verifying the plurality of non-volatile memory cells for the first verify condition for the data state.

In one example implementation, the doses of programming comprise a series of programming voltage pulses that increase in magnitude from pulse to pulse; the first verify condition is an intermediate verify reference voltage for the first data state; and the second verify condition is a final verify reference voltage for the first data state.

One embodiment includes a non-volatile storage apparatus comprising a three dimensional array of non-volatile memory cells; means for programming the memory cells by applying series of programming voltage pulses to the memory cells; and means for verifying the programming between programming voltage pulses by testing whether non-volatile memory cells have reached an intermediate verify reference voltage for a data state without testing whether non-volatile memory cells have reached a final verify reference voltage for the data state until more than a predetermined number of memory cells have reached the intermediate verify reference voltage for the data state, testing whether non-volatile memory cells have reached the intermediate verify reference voltage and testing whether non-volatile memory cells have reached the final verify reference voltage after the predetermined number of memory cells have reached the intermediate verify reference voltage and until a testing criteria is met such that the testing criteria is other than an amount of memory cells reaching the intermediate verify reference voltage, and testing whether non-volatile memory cells have reached the final verify reference voltage without testing whether non-volatile memory cells have reached the intermediate verify reference voltage for the data state after the testing criteria is met.

For purposes of this document, the means for programming can be implemented by a microprocessor, microcontroller, state machine, FPGA or other type of processor in combination with decoders, sense amplifiers, voltage and current sources and other control logic performing the processes of FIGS. 5, 6, 8, 13A, 13B, and/or 14 (step 702). For example, the means for programming may comprise control circuitry 310, decoders 324/332 and read/write circuits 328 of FIG. 2 performing the processes of FIGS. 5, 6, 8, 13A, 13B, and/or 14 (step 702). In some embodiments, the means for programming may comprise controller 120 performing the processes of FIGS. 5, 6, 8, 13A, 13B, and/or 14 (step 702) with or without support from the circuits on the memory die (e.g., memory die 300 of FIG. 2). In some embodiments, the means for programming may comprise controller 120, control circuitry 310, decoders 324/332 and read/write circuits 328 performing the processes of FIGS. 5, 6, 8, 13A, 13B, and/or 14 (step 702).

For purposes of this document, the means for verifying can be implemented by a microprocessor, microcontroller, state machine, FPGA or other type of processor in combination with decoders, sense amplifiers, voltage and current sources and other control logic performing the processes of FIGS. 5, 6, 8, 13A, 13B, and/or 14 (step 702). For example, the means for verifying may comprise control circuitry 310, decoders 324/332 and read/write circuits 328 of FIG. 2 performing the processes of FIGS. 8 (step 574), 12, 13A, 13B, 14, 18 and/or 19. In some embodiments, the means for verifying may comprise controller 120 performing the processes of FIGS. 8 (step 574), 12, 13A, 13B, 14, 18 and/or 19 with or without support from the circuits on the memory die (e.g., memory die 300 of FIG. 2). In some embodiments, the means for verifying may comprise controller 120, control circuitry 310, decoders 324/332 and read/write circuits 328 performing the processes of FIGS. 8 (step 574), 12, 13A, 13B, 14, 18 and/or 19.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a plurality of non-volatile memory cells; and
   a control circuit connected to the non-volatile memory cells, the control circuit is configured to:
   perform a programming process that programs the non-volatile memory cells to a first data state,
   perform program verification for a first verify condition for the first data state without performing program verification for a second verify condition for the first data state during the programming process until a first criteria is satisfied,
   perform program verification for the first verify condition and the second verify condition during the programming process after the first criteria is satisfied and until a second criteria is satisfied, and
   perform program verification for the second verify condition without performing program verification for the first verify condition during the programming process after the second criteria is satisfied.

2. The non-volatile storage apparatus of claim 1, wherein: the second criteria is satisfied when a threshold number of the plurality of non-volatile memory cells have reached the second verify condition.

3. The non-volatile storage apparatus of claim 1, wherein: the control circuit is configured to program the plurality of non-volatile memory cells by applying doses of programming to the plurality of non-volatile memory; and the second criteria is satisfied after a predetermined number of doses of programming have been applied to the plurality of non-volatile memory after the first criteria is satisfied.

4. The non-volatile storage apparatus of claim 1, wherein:
the control circuit is configured to program a selected set of non-volatile memory cells to multiple data states such that each non-volatile memory cell of the set of non-volatile memory cells stores multiple bits of data;
the plurality of non-volatile memory cells are a first subset of the selected set of non-volatile memory cells;
the control circuit is configured to program a second subset of the selected set of non-volatile memory cells to a second data state; and
the second criteria is satisfied when a minimum number of the second subset of the selected set of non-volatile memory cells has reached a target level for the second data state.

5. The non-volatile storage apparatus of claim 1, wherein:
the second criteria is other than an amount of the plurality of memory cells reaching the first verify condition.

6. The non-volatile storage apparatus of claim 1, wherein:
the first criteria is satisfied when a threshold number of the plurality of non-volatile memory cells have reached the first verify condition.

7. The non-volatile storage apparatus of claim 1, wherein:
the control circuit is configured to program the plurality of non-volatile memory cells by applying to the plurality of non-volatile memory cells series of programming voltage pulses that increase in magnitude from pulse to pulse.

8. The non-volatile storage apparatus of claim 7, wherein:
the control circuit is configured to perform the program verification between the programming voltage pulses.

9. The non-volatile storage apparatus of claim 1, wherein:
the control circuit is configured to perform program verification for the first verify condition by testing whether threshold voltages of the plurality of non-volatile memory cells are at a first verify reference voltage; and
the control circuit is configured to perform program verification for the second verify condition by testing whether threshold voltages of the plurality of non-volatile memory cells are at a second verify reference voltage.

10. The non-volatile storage apparatus of claim 9, wherein:
the first verify reference voltage is an intermediate verify reference voltage; and
the second verify reference voltage is a final verify reference voltage.

11. The non-volatile storage apparatus of claim 9, wherein:
the control circuit is configured to slow down programming, during the programming process, of memory cells of the plurality of memory cells that have threshold voltages greater than the first verify reference voltage and less than the verify reference voltage; and
the control circuit is configured to inhibit programming, during the programming process, of memory cells of the plurality of memory cells that have threshold voltages greater than the second verify reference voltage.

12. The non-volatile storage apparatus of claim 1, wherein:
the plurality of non-volatile memory cells comprise a three dimensional NAND strings.

13. A method for programming non-volatile storage, comprising:
applying doses of programming to a plurality of non-volatile memory cells being programmed to a first data state; and
performing program verification between the doses of programming, the performing program verification comprises:
verifying the plurality of non-volatile memory cells for a first verify condition for the first data state while skipping verifying the plurality of non-volatile memory cells for a second verify condition for the first data state,
determining that an amount of memory cells that have satisfied the first verify condition meets a first criteria,
in response to determining that an amount of memory cells that have satisfied the first verify condition meets the first criteria, verifying the plurality of non-volatile memory cells for the first verify condition for the data state and verifying the plurality of non-volatile memory cells for the second verify condition for the data state,
determining that second criteria is satisfied, and
in response to determining that an amount of memory cells that second criteria is satisfied, verifying the plurality of non-volatile memory cells for the second verify condition for the data state while skipping verifying the plurality of non-volatile memory cells for the first verify condition for the data state.

14. The method of claim 13, wherein:
the second criteria is satisfied when a threshold number of the plurality of non-volatile memory cells have satisfied the second verify condition.

15. The method of claim 13, wherein:
the second criteria is satisfied after a predetermined number of dose of programming have been applied to the plurality of non-volatile memory after the first criteria is satisfied.

16. The method of claim 13, wherein:
the applying doses of programming includes applying the doses of programming to a selected set of non-volatile memory cells to program the selected set of non-volatile memory cells to multiple data states such that each non-volatile memory cell of the set of non-volatile memory cells stores multiple bits of data;
the plurality of non-volatile memory cells are a first subset of the selected set of non-volatile memory cells;
a second subset of the selected set of non-volatile memory cells are programmed to a second data state in response to the doses of programming; and
the second criteria is satisfied when a minimum number of the second subset of the selected set of non-volatile memory cells has reached a target level for the second data state.

17. The method of claim 13, wherein:
the second criteria is other than an amount of the plurality of memory cells reaching the first verify condition.

18. The method of claim 13, further comprising:
slowing down programming for non-volatile memory cells that have satisfied the first verify condition; and
inhibiting programming for non-volatile memory cells that have satisfied the second verify condition.

19. The method of claim 13, further comprising:
the doses of programming comprise a series of programming voltage pulses that increase in magnitude from pulse to pulse;

the first verify condition is an intermediate verify reference voltage for the first data state; and the second verify condition is a final verify reference voltage for the first data state.

20. A non-volatile storage apparatus, comprising:
a three dimensional array of non-volatile memory cells;
means for programming the memory cells by applying series of programming voltage pulses to the memory cells; and
means for verifying the programming between programming voltage pulses by testing whether non-volatile memory cells have reached an intermediate verify reference voltage for a data state without testing whether non-volatile memory cells have reached a final verify reference voltage for the data state until more than a predetermined number of memory cells have reached the intermediate verify reference voltage for the data state, testing whether non-volatile memory cells have reached the intermediate verify reference voltage and testing whether non-volatile memory cells have reached the final verify reference voltage after the predetermined number of memory cells have reached the intermediate verify reference voltage and until a testing criteria is met such that the testing criteria is other than an amount of memory cells reaching the intermediate verify reference voltage, and testing whether non-volatile memory cells have reached the final verify reference voltage without testing whether non-volatile memory cells have reached the intermediate verify reference voltage for the data state after the testing criteria is met.

* * * * *